United States Patent
Min et al.

(10) Patent No.: US 7,336,549 B2
(45) Date of Patent: Feb. 26, 2008

(54) REDUNDANCY CIRCUIT AND REPAIR METHOD FOR A SEMICONDUCTOR MEMORY DEVICE

(75) Inventors: Byung-Jun Min, Yongin-si (KR); Kang-Woon Lee, Seoul (KR); Han-Joo Lee, Seoul (KR); Byung-Gil Jeon, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 84 days.

(21) Appl. No.: 11/238,198

(22) Filed: Sep. 29, 2005

(65) Prior Publication Data

US 2006/0092725 A1  May 4, 2006

(30) Foreign Application Priority Data

Nov. 1, 2004  (KR) .................. 10-2004-0087784

(51) Int. Cl.
*G11C 7/00* (2006.01)
(52) U.S. Cl. ....................... 365/200; 365/201
(58) Field of Classification Search ........... 365/185.09
See application file for complete search history.

(56) References Cited

U.S. PATENT DOCUMENTS

| | | | | |
|---|---|---|---|---|
| 5,699,306 A | * | 12/1997 | Lee et al. ................ 365/200 |
| 5,726,930 A | * | 3/1998 | Hasegawa et al. .......... 365/145 |
| 5,946,247 A | * | 8/1999 | Osawa et al. ............... 365/201 |
| 6,025,736 A | * | 2/2000 | Vora et al. ................... 326/39 |
| 6,157,585 A | * | 12/2000 | Kim ........................ 365/200 |
| 6,166,981 A | | 12/2000 | Kirihata et al. .......... 365/225.7 |
| 6,317,355 B1 | | 11/2001 | Kang ....................... 365/145 |
| 6,966,012 B1 | * | 11/2005 | Gandhi ........................ 714/7 |

* cited by examiner

*Primary Examiner*—Amri Zarabian
*Assistant Examiner*—Jason Lappas
(74) *Attorney, Agent, or Firm*—F. Chau & Assoc., LLC

(57) ABSTRACT

A redundancy circuit and repair method for a semiconductor memory device. The redundancy circuit comprises an address buffer for outputting a first internal address and a second internal address (used only during redundancy programming to carry failed memory addresses) based on an external address; and address storage and comparison units, each one of the address storage and comparison units being selected for programming using the second internal address. The address storage and comparison units comprise ferroelectric storage cells that store the address of a defective (failed) main memory cell and outputs a redundancy decoder enable signal in response to a first internal address matching the stored (second internal) address. Accordingly, the redundancy circuit with ferroelectric storage cells and a repair method allows the performance of a second repair when a defective cell is detected after a first repair or after a packaging process.

5 Claims, 20 Drawing Sheets

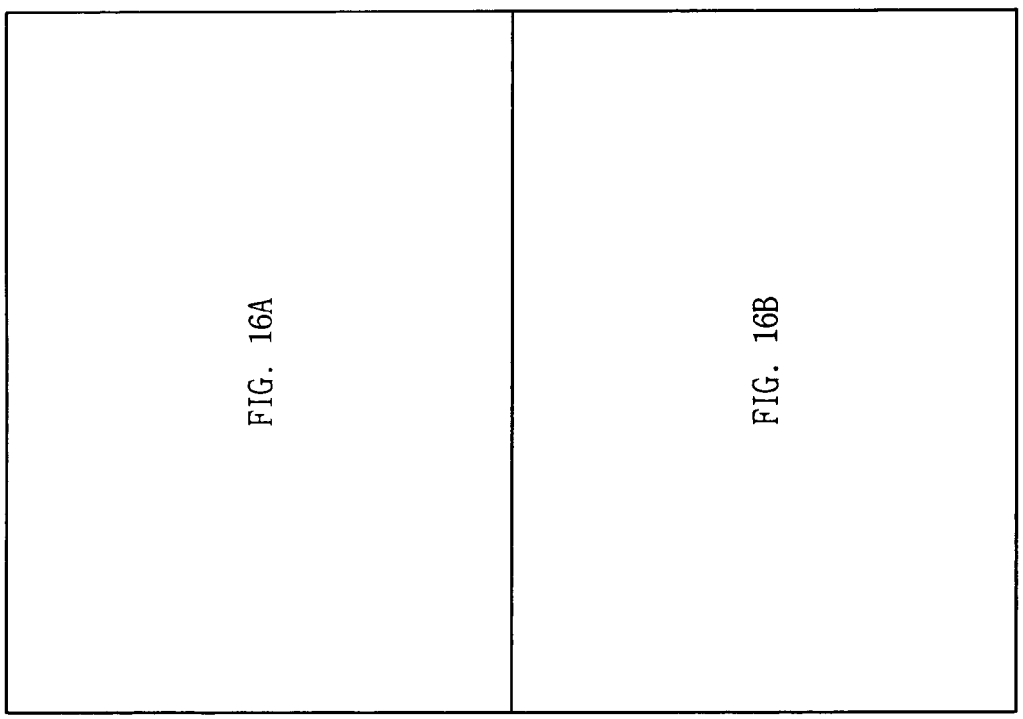

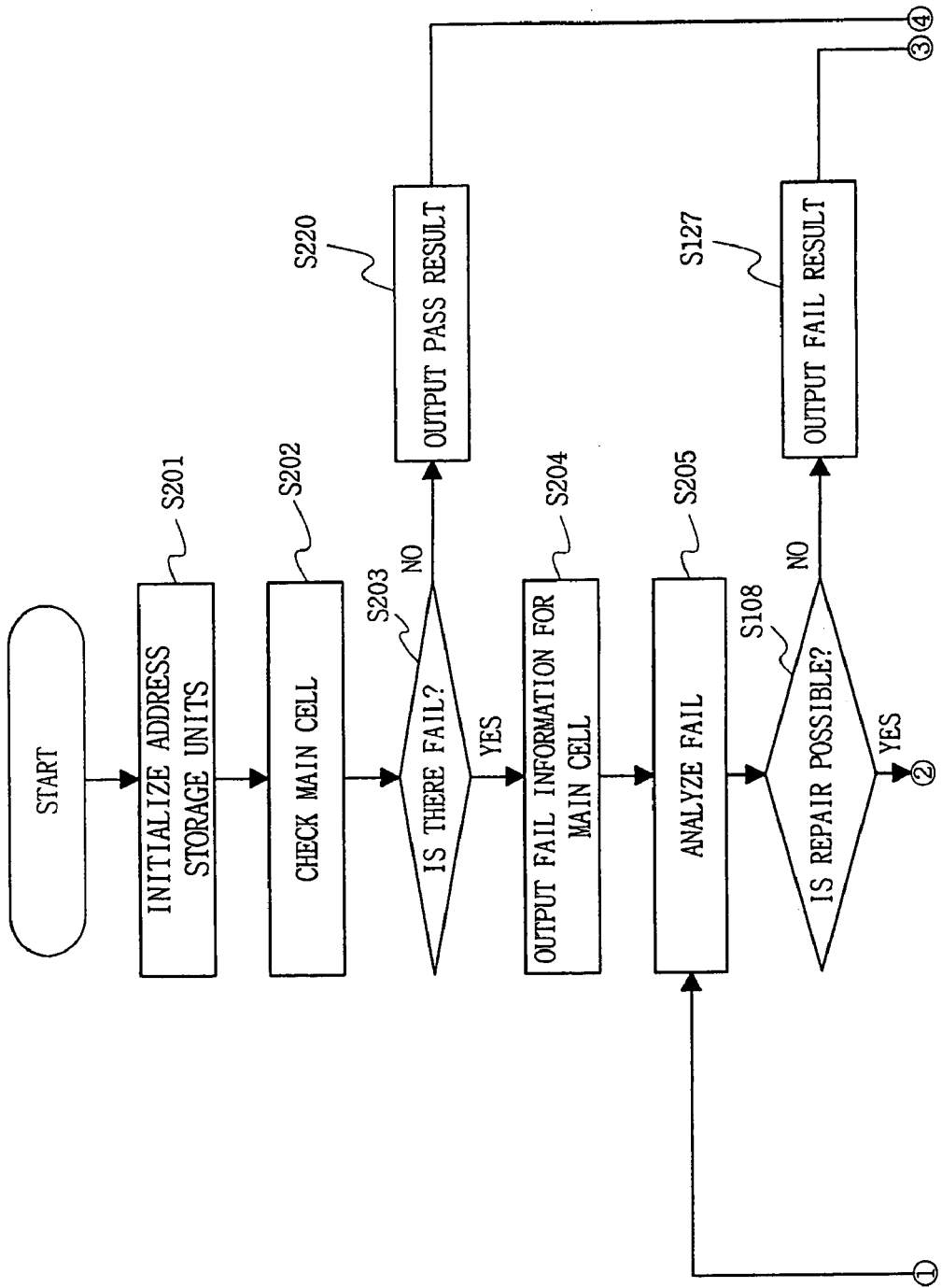

REDUNDANCY CIRCUIT AND REPAIR METHOD FOR A SEMICONDUCTOR MEMORY DEVICE

CROSS-REFERENCE TO RELATED APPLICATION

This application claims the priority under 35 USC § 119 of Korean Patent Application No. 10-2004-0087784, filed Nov. 1, 2004, the disclosure of which is hereby incorporated herein by reference in its entirety.

BACKGROUND OF THE INVENTION

1. Technical Field

The invention relates to semiconductor memory devices and, more particularly, to a resetable redundancy circuit for a semiconductor memory device.

2. Discussion of Related Art

The demand for large highly integrated memory devices continues to increase with the increasing consumer demand for portable electronic devices (such as computers, digital cameras, music players etc.) and appliances increases. As the capacity (e.g., gigabytes) of semiconductor memory devices increases, there is a greater likelihood that a few defective memory cells will be created due to defects and contaminants in the fabrication of the memory devices. If the memory device includes at least one defective cell, it will not work and be treated as a defective product unless it can be "repaired".

To discard defective memory devices reduces the yield especially in the case there is a higher likelihood of creating a few defective cells due to the increasing integration (capacity) of the semiconductor memory devices. Redundant memory cells are provided to increase the yield of memory devices. A redundant cell, row, or column of cells can be used to salvage devices having fewer than a specified number of defective cells, and thus increase yield. As memories become larger, the yield of perfect memory chips becomes lower, since having a larger number of cells on a silicon chip provides more opportunity for defective cells.

A redundancy circuit fabricated with the memory device is provided to reduce the loss of memory chips due to defects of the memory devices caused by the above-stated defects and contaminants. The redundancy circuit includes an array of "spare" memory cells (a redundancy cell array) that can be used in a substituted manner instead of the anticipated few defective memory cells. Redundancy memory elements are formed by memory cells identical to the memory cells of the memory matrix, and are arranged in rows (redundancy rows) or columns (redundancy columns). The redundancy circuit controls the selection of a given redundancy row or redundancy column in substitution for a defective row or column of the main memory matrix, i.e., a row or column in which at least one defective memory cell is detected.

Repair methods using such a redundancy circuit include: a physical method of burning and cutting a fuse or making a junction to be short-circuited with for example a laser beam; a method of electrically melting and cutting a fuse by flowing over-current through it; an electric fuse method of programming with EPROM memory cells, and the like.

Hereinafter, a conventional redundancy circuit will be described with reference to the accompanying drawings.

FIG. 1 is a circuit diagram of a redundancy circuit used in a conventional physical repair method using a laser beam.

Referring to FIG. 1, the redundancy circuit is composed of a redundancy enable fuse F1 for enabling the redundancy circuit; several fuse boxes 2 for receiving addresses A0P, A1P, . . . , AiP, . . . , AnP to program an address that specifies one defective cell; one or more NAND-gates NAND1, . . . , NANDm for receiving comparison signals RA0P, RA1P, . . . , RAiP, . . . , RAnP output by the fuse boxes 2 and generating a NAND output; a NOR-gate NOR1 for receiving output signals from the NAND-gates NAND1, . . . , NANDm and generating a NOR output; a first master signal FUSE_EN and a second (complementary) master signal FUSE_ENB for controlling the overall redundancy circuit including the redundancy enable fuse F1 and the fuse boxes 2; a first inverter INV1 for generating the first master signal FUSE_EN; a second inverter INV2 for generating the second master signal FUSE_ENB; and NMOS transistors N1, . . . , Nm that receive the second master signal FUSE_ENB as a gate input and are connected between the NAND-gates NAND1, . . . , NANDm and a ground terminal. Here, the NOR-gate NOR1 generates an enable signal RD_i for enabling a redundancy decoder (not shown).

FIG. 2 is a detailed circuit diagram of a fuse box in the redundancy circuit of FIG. 1.

Referring to FIG. 2, the fuse box is composed of a third inverter INV3, a pair of CMOS transistors 4 and 14, and address fuses 6 and 16. If the address AiP is high, the third inverter INV3 converts the address AiP from high to low. The high signal is inputted to the CMOS transistor 14 and the low signal is inputted to the CMOS transistor 4. The other ends of the CMOS transistors 4 and 14 are connected to the address fuses 6 and 16, respectively. The state of the comparison signal RAiP, which is an output of the fuse box, is determined depending on the input address by physically cutting one of the address fuses 6 and 16 with the laser beam.

Referring to FIGS. 1 and 2, the comparison signals RAiP are required to be high to enable the redundancy circuit. That is, the comparison signals RA0P, RA1P, RAiP, . . . , RAnP are subject to NAND operation in the NAND-gates NAND1, . . . , NANDm. The NAND-gates NAND1, . . . , NANDm will all output a low output when the comparison signals RA0P, RA1P, RAiP, . . . , RAnP input to the NAND-gates NAND1, . . . , NANDm are all high. As a result, the NOR-gate NOR1, which receives all low signals, outputs the high enable (match) signal RD_i.

To repair a defective cell using the redundancy circuit, the redundancy enable fuse F1 is first cut by the laser beam. In this case, the first master signal FUSE_EN becomes high and the second master signal FUSE_ENB becomes low. Accordingly, the CMOS transistors 4 and 14 in the fuse box 2 are all turned on and the NMOS transistors N1, . . . , Nm are all turned off, enabling the redundancy circuit. The repair is completed by cutting one of the two address fuses 6 and 16 in the fuse box 2 corresponding to an opposite state of an address indicating a defective cell. When the repair is completed and then the same address as the stored address is input to the redundancy circuit while the semiconductor memory device operates, the comparison signals RA0P, RA1P, RAiP, . . . , RAnP become all high and the enable signal RD_i becomes high through the NAND-gates N1, . . . , Nm and the NOR-gate. The enable (match) signal RD_i is used to disable a main decoder (not shown) and enable the redundancy decoder, such that the redundancy cell is substituted for the defective cell.

However, there is a limitation with the above-described physical repair method in which a fuse is cut using a laser beam in that additional repairing is not allowed to be performed when a defective cell is created following a repairing or packaging process.

There is another problem with the physical repair method in which a fuse is cut using the laser beam in that the use of the method adds a separate additional process in fabricating a semiconductor memory device.

SUMMARY OF THE INVENTION exemplary embodiments of the invention provides a redundancy circuit using ferroelectric storage cells for non-volatile storage of the addresses of failed main memory cells, and a repair method that is capable of allowing additional and post-packaging repairs to be performed if a defective cell is created or detected after a repairing or packaging process. The redundancy circuits comprise non-volatile memory word circuits to store addresses of the defective rows or columns, so that when the defective rows or columns of the main memory are accessed (during reading or programming) the defective main memory cells are not selected, and the corresponding redundancy rows or redundancy columns are instead selected. The functional substitution of defective rows or columns with redundancy ones is typically performed during the in-factory testing of the memory device, and is typically transparent to the end user.

An aspect of the invention provides a redundancy circuit using a plurality of ferroelectric storage cells (for non-volatile storage of the addresses of failed main memory cells) and a repair method that can be performed without a limitation of the number or times that repairs of a defective cell can be performed.

Another aspect of the invention provides a redundancy circuit of a semiconductor memory device, comprising: a non-volatile content-addressable memory (CAM) configured to store defective addresses of a main memory array and configured to output a match signal when an internal address of the semiconductor memory device is the same as a stored (defective) address. The match signal is used as a redundancy decoder enable signal. The non-volatile content-addressable memory (CAM) includes a plurality of ferroelectric storage cells and may include a combinatorial logic circuit (instead of a conventional "match line" sensing circuit). The ferroelectric storage cells are configured in words to store the bits of each defective address of the defective main memory array. The non-volatile content-addressable memory (CAM) is static (not dynamic, and requires no "refresh") and the ferroelectric storage cells are latched, as in a SRAM memory device.

Another aspect of the invention provides a redundancy circuit using a plurality of ferroelectric storage cells (for non-volatile storage of the addresses of failed main memory cells) and facilitates a method for self-repair that can be performed automatically (e.g., upon Power ON,) e.g., using an on-chip Built-in Self Test (BIST), or under the direction of an end-user (e.g., under the control of a personally owned General Purpose microcomputer and without specialized external test equipment), even for memory cell fails that occur after the purchase by an end-user (e.g., a consumer) or after installation in an appliance. Recent technology advances in memory BIST have made it the most prevalent method for testing embedded memories. The basic operation of a memory BIST is straightforward: First, the memory is put into a test mode by the use of muxes placed on every data, address, and control line. A finite state machine writes a test pattern to a memory cell, reads it back, and compares it to the original value. If a mismatch occurs, a flag is set to show that the memory cell under test has a failure, and the BIST may be suspended while the failed memory cell's address is programmed into a non-volatile address storage unit in a redundancy circuit in accordance with an embodiment of the present invention.

Yet another aspect of the invention provides a redundancy circuit having ferroelectric storage cells (for non-volatile storage of the addresses of failed main memory cells) and a repair method, which is capable of eliminating a need for an additional separate process for an optical window (used in the physical repair method in which a fuse is cut using a laser beam) in the fabricating a semiconductor memory device.

It is useful to have the ability to test the redundancy circuits (e.g., testing a redundant memory cell array therein) prior to repair. Accordingly, an aspect of the invention provides pre-repair testable redundancy circuits. In embodiments of the present invention, it is possible to test the redundant memory cells of the redundant memory cell array (wherein the failed main memory cell addresses are to be stored) by using the same direct memory access circuits normally provided in the memory device to test the memory cells of the main memory array.

According to an aspect of the invention, there is provided a redundancy circuit of a semiconductor memory device, comprising: an address buffer for outputting an internal address based on an external address; and a plurality of address storage and comparison units, one of the address storage and comparison units being selected (activated) and outputting a redundancy decoder enable signal if the internal address specifies the address of a (stored) defective (failed) memory cell, wherein the address storage and comparison units comprise ferroelectric storage cells for storing the address of a defective memory cell (i.e., a failed cell address).

Preferably, the address buffer is controlled by an external redundancy circuit enable signal that also enables the redundancy circuit to make a repair.

Preferably, the address buffer outputs a first (main) internal address but also a second internal address that is obtained by ANDing the external address and the external redundancy circuit enable signal. This provides a second internal address bus for carrying (only) the addresses of defective memory cells for use to program the redundancy circuit, (e.g., without affecting the main internal address bus with parasitic capacitance from the redundancy circuit).

Preferably, each address storage and comparison unit comprises a master cell for storing and generating (latching) a unit-enable signal to enable the output of the address storage and comparison unit.

Preferably, each address storage and comparison unit comprises a plurality of (non-volatile, ferroelectric) address bit storage and comparison cells for comparing the main first internal address to the stored failed memory address and for outputting bit comparison signal to be combined to output a match signal to be used as a redundancy decoder enable signal.

Preferably, the match signal is high when the first internal address output from the address buffer and the stored failed memory address are the same, and is low when the two addresses are not the same.

According to another aspect of the invention, there is provided a redundancy circuit of a semiconductor memory device, comprising: an address buffer controlled by an external redundancy circuit enable signal and outputting first and second internal addresses; a control block for outputting an internal redundancy circuit enable signal, a plate pulse, a sense amp enable signal, and a bit line precharge signal (e.g., in response to the external redundancy circuit enable signal); an address storage unit selector controlled by the internal redundancy circuit enable signal for outputting an address storage unit selection signal based on the second internal address; and address storage and comparison units to be selected by the address storage unit selection signal, wherein each of the address storage and comparison units comprise ferroelectric storage cells that store one failed memory address (received via the second internal address) and outputs a redundancy decoder enable signal (match signal) in response to the first internal address being equal to the stored failed (main memory) cell address.

Preferably, the address buffer outputs the second internal address (e.g., a failed main memory cell address) by NANDing the external address and the external redundancy circuit enable signal, and outputs the second internal address as a buffered signal.

Preferably, the plate pulse is activated when power supplied to the redundancy circuit reaches a predetermined level. The plate pulse is also activated by an external reset signal for initializing all the address storage and comparison units in an address comparing block.

Preferably, the sense amp enable signal is controlled by the plate pulse and power supplied to the redundancy circuit, and the plate pulse is delayed relative to the power.

Preferably, the bit line precharge signal is controlled by the plate pulse and power supplied to the redundancy circuit.

Preferably, the internal redundancy circuit enable signal is controlled by the sense amp enable signal.

Preferably, the sense amp enable signal is delayed relative to the external redundancy circuit enable signal.

Preferably, each address storage and comparison unit comprises a drive circuit for outputting an internal repair signal based on the address storage unit selection signal and an external repair disable signal. The internal repair signal sets the control bit in the master cell and enables the unit for redundancy programming (e.g., storage of a failed memory cell address).

Preferably, the drive circuit further outputs an internal repair disable signal as a response to a combination of the address storage unit selection signal and the external repair disable signal, or as a response to the external redundancy circuit reset signal. The internal repair disable signal resets the unit-control bit in the master cell and thus inhibits the output of the unit.

Preferably, each address storage and comparison unit comprises a master cell for storing a unit-control bit for controlling the output of the redundancy decoder enable signal by the unit. The unit-control bit is set in response to the internal repair signal and the plate pulse; and is reset in response to the internal repair disable signal and the plate pulse.

Preferably, the master cell comprises at least one ferroelectric storage cell (e.g., two complementary ferroelectric storages cells).

Preferably, each address storage and comparison unit comprises a plurality of (ferroelectric) address bit storage and comparison cells (e.g., ferroelectric CAM cells), and each address storage and comparison unit outputs a redundancy decoder enable signal in the event of a matching address.

Preferably, each address storage and comparison unit comprises a plurality of ferroelectric storage (CAM) cells for storing a failed cell address, and for comparing the bits o the stored (failed) memory cell address in the ferroelectric storage cell to the bits of a (first) internal address, and when all bits are the same, the unit outputs the redundancy decoder enable signal.

According to still another aspect of the invention, there is provided a redundancy circuit of a semiconductor memory device, comprising: an address buffer for outputting a first (main) internal address and a second (failed memory cell) internal address (e.g., conveying only failed cell address to the redundancy circuit); an address storage unit selector for outputting an address storage unit selection signal (e.g., that selects a address storage and comparison unit based on the failed cell address to be stored therein); and a plurality of address storage and comparison units, each one of the address storage and comparison units being individually selected by the address storage unit selection signal. The address storage and comparison units comprise ferroelectric storage cells that store the failed cell address information (received via the second internal address) and output a redundancy decoder enable signal in response to a match between the stored (failed) memory address and the main (first) internal address.

Preferably, the ferroelectric storage cells are controlled by a plate pulse, a sense amp enable signal, and a bit line precharge signal.

Preferably, the plate pulse, the sense amp enable signal, and the precharge signal are output from a control block responsive when power supplied to the redundancy circuit is at a predetermined level.

Preferably, the control block is responsive to an output from a power sensor, the power sensor outputting a power on/off signal when the power reaches a predetermined level.

According to still another aspect of the invention, there is provided a redundancy circuit for generating a signal to enable the redundancy decoder in response to an (external) address (without using physical fuses for redundancy programming), the (external) address indicating a failed (defective) one of memory cells in a main memory cell array of a semiconductor memory device, the circuit comprising: a plurality of unit address storage and comparison units each having a non-volatile master cell and a plurality of non-volatile address bit storage and comparison cells, the plurality of the address bit storage and comparison cells corresponding to bits of the (failed) address to be stored, wherein when the master cell is activated, if there is a match between the stored (failed) address and the external address the redundancy decoder enable signal is output via the corresponding address storage and comparison unit. The redundancy circuit may further comprise a redundancy circuit control block for controlling the address storage and comparison units based on (external) redundancy circuit related signals.

Another aspect of the invention provides a repair method with a redundancy circuit in a semiconductor memory device, comprising: initializing a plurality of address storage and comparison units, each address storage and comparison unit comprising ferroelectric storage cells configured to store an address that specifies a defective memory cell; selecting one of the address storage and comparison units based upon the address that specifies a defective memory cell. The method may further comprise determining whether to perform a row repair or a column repair and selecting one of the address storage and comparison units based upon whether to perform a row repair or a column repair.

Another aspect of the invention provides a repair method with a redundancy circuit in a semiconductor memory device, comprising: initializing a plurality of ferroelectric storage cells configured to store the bits of an address that specifies a defective memory cell; storing the bits of an address that specifies a defective memory cell in a set among the plurality of ferroelectric storage cells; comparing the stored bits of an address that specifies a defective memory cell with the bits of an external address. The method may further comprise: determining whether the defective cell can be repaired; and selecting the set among the plurality of ferroelectric storage cells based upon the address to be stored therein.

BRIEF DESCRIPTION OF THE DRAWINGS

The above and other features and advantages of the invention will become more apparent to those of ordinary skill in the art by describing in detail preferred embodiments thereof with reference to the attached drawings in which like numbers refer to like elements, and.

DETAILED DESCRIPTION OF EMBODIMENTS OF THE INVENTION

Figure 1:
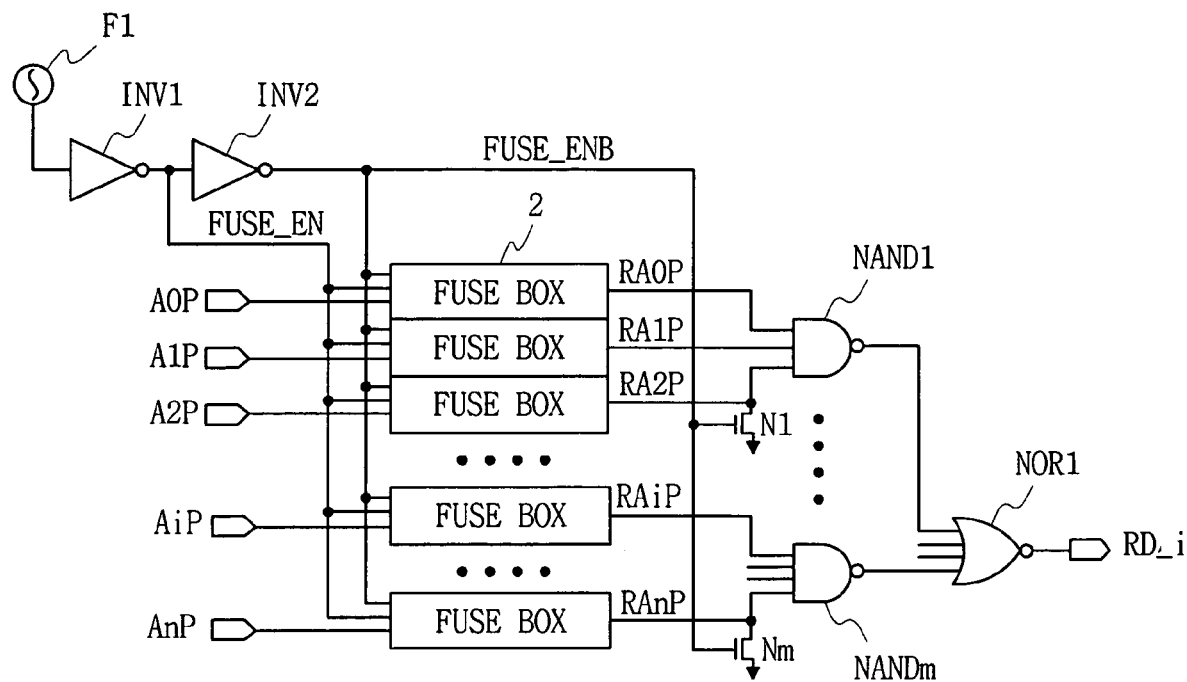
FIG. 1 is a circuit diagram of a redundancy circuit used in a conventional physical repair method using a laser beam.
Figure 2:
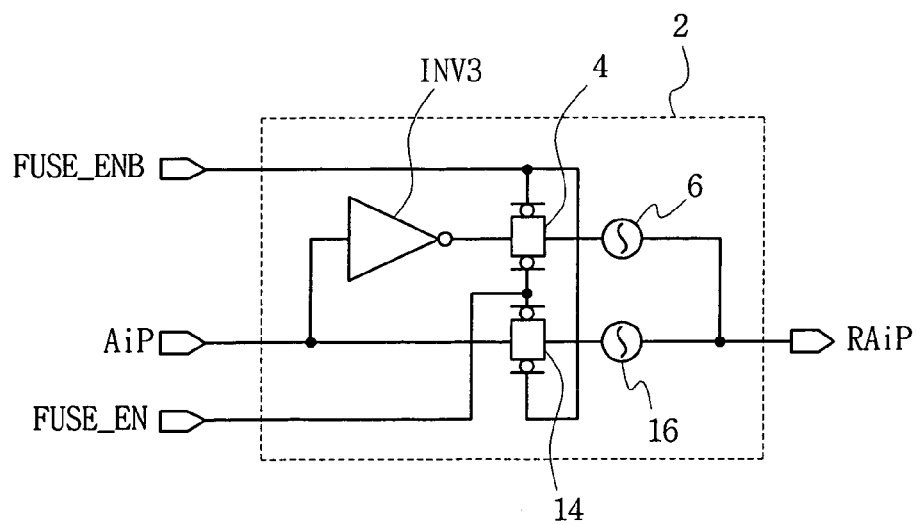
FIG. 2 is a detailed circuit diagram of a fuse box in the redundancy circuit of FIG. 1.
Figure 3:
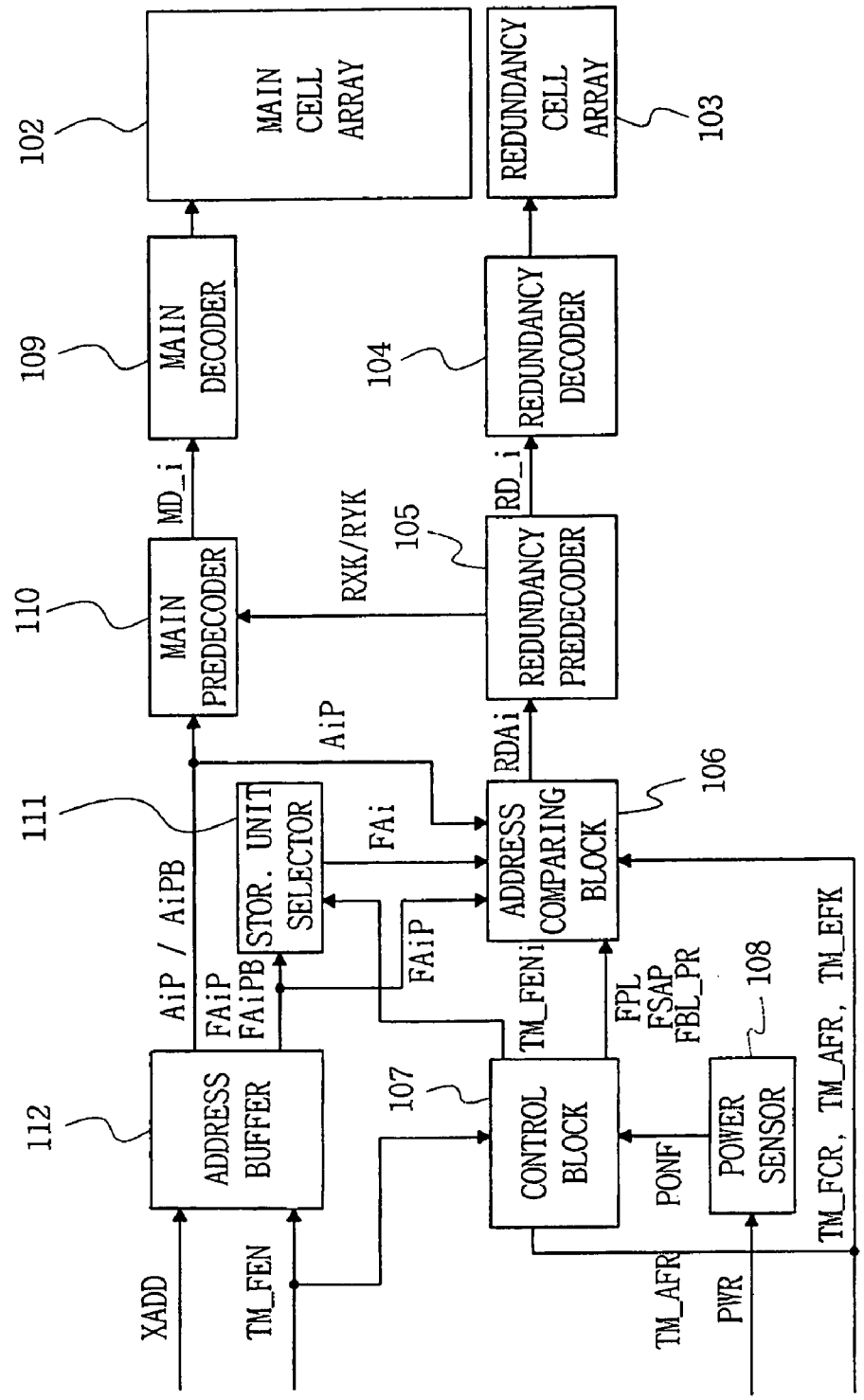
FIG. 3 is a block diagram of a semiconductor memory device with a redundancy circuit having ferroelectric failed-address storage cells according to an embodiment of the invention.

FIG. 3 is a block diagram of a semiconductor memory device having a redundancy circuit comprising a plurality of ferroelectric (content addressable) storage cells for storing failed memory addresses, according to an embodiment of the invention.

Referring to FIG. 3, a semiconductor memory device includes a main memory cell array 102, a redundancy cell array 103, an address buffer 112, a main predecoder 110, a main decoder 109, a redundancy predecoder 105, a redundancy decoder 104, an address storage unit selector 111, a power sensor 108, a redundancy circuit control block 107, and an address comparing block 106.

To access a normal (main memory 102) cell, not a defective (main memory 102) cell, an external address XADD is input to the address buffer 112, a first internal address AiP/AiPB as a buffered address from the address buffer 112 is converted to an intermediate signal MD_i by the main predecoder 110, and the intermediate signal MD_i is decoded at the main decoder 109 so that a desired cell in the main cell array 102 is accessed.

On the other hand, when a defective (main memory 102) cell is detected, a repair process is performed in which its address is programmed (stored) in the address comparing block 106 to specify the defective cell for repairing. When the defective (main memory 102) cell is repaired and then the same address as the stored defective address is input, the address comparing block 106 and the redundancy cell array 103 operates. In such a case, an output signal RXK/RYK from the redundancy predecoder 105 disables the main predecoder 110 and enables the redundancy decoder 104, such that a redundancy cell in the redundancy cell array 103 is substituted for the defective main memory cell.

The redundancy circuit's control block 107 receives an external redundancy circuit enable signal TM_FEN and generates control signals, such as an internal redundancy circuit enable signal TM_FENi, a sense amp enable signal FSAP, a bit line precharge signal FBL_PR, and a plate pulse FPL for programming the non-volatile (e.g., ferroelectric) storage cells in the address comparing block 106. The external redundancy circuit enable signal TM_FEN may be provided from an external test device, or from an embedded memory-BIST circuit (not shown), to repair the defective main memory cell.

The address comparing block 106 operates based on receiving the control signals from the control block 107, and an external redundancy circuit reset signal TM_AFR, an external repair disable signal TM_FCR and an external redundancy circuit disable signal TM_EFK.

The address storage unit selector 111 receives the second internal (failed cell) address FAiP/FAiPB from the address buffer 112 and the internal redundancy circuit enable signal TM_FENi, and uses the second internal (failed cell) address FAiP/FaiPB to select one of the address storage and comparison units (106X or 106Y). The redundancy predecoder 105 predecodes the redundancy decoder enable signal RDAi that is a signal output from the address comparing block 106. The redundancy decoder 104 decodes a pre-decoded signal RDi to select the redundancy cell in the redundancy cell array 103.

Figure 4:
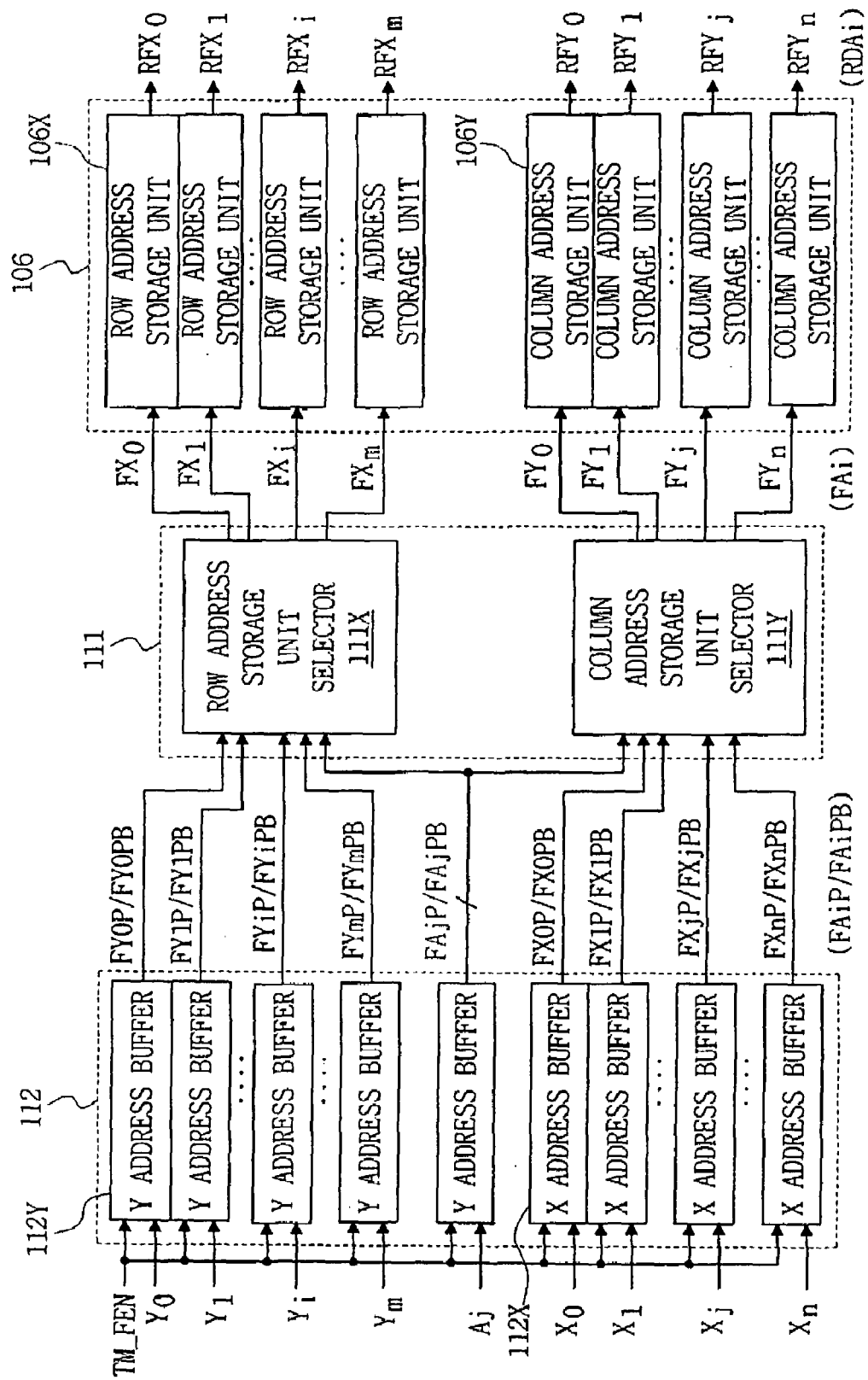
FIG. 4 is a detailed block diagram illustrating interconnections and internal structures of the address buffer 112, the address storage unit selector 111, and the address comparing block 106 in FIG. 3.

FIG. 4 is a detailed block diagram illustrating interconnections and internal structures of the address buffer 112, the address storage unit selector 111, and the address comparing block 106 in FIG. 3;

Referring to FIG. 4, upon receipt of an external redundancy circuit enable signal TM_FEN (e.g., from an external test device) to repair a defective cell, the address buffers 112X and 112Y generate second internal (failed cell) address (FAiP/FAiPB of FIG. 3) to avoid affecting the normal operation of the semiconductor memory device. In FIG. 4, the second internal (failed cell) address (FAiP/FAiPB of FIG. 3) represent failed row addresses FXjP/FXjPB (j=0,1, 2, . . . ,m) and failed column addresses FYiP/FYiPB (i=0,1,2, . . . ,n). The address storage unit selector 111 receives the second internal (failed cell) address FAiP/FAiPB to select one of the address storage and comparison units (106X or 106Y) for repairing the defective cell. Here, the address storage unit selector 111 is divided into a row address storage unit selector 111X and a column address storage unit selector 111Y.

The row address storage unit selector 111X generates row address storage unit selection signals FX0, FX1, FX2, . . . , FXm using the column addresses Y0, Y1, Y2, . . . , Ym. The row address storage unit selection signals FX0, FX1, FX2, . . . , FXm are used to select one of $2^{m+1}$ row address storage and comparison units (106X or 106Y).

Further, the column address storage unit selector 111Y generates column address storage unit selection signals FY0, FY1, FY2, . . . , FYn using the row addresses X0, X1, X2, . . . , Xn. The column address storage unit selection signals FX0, FX1, FX2, . . . , FXm are used to select one of $2^{n+1}$ column address storage and comparison units 106Y. This structure eliminates a need for a separate (e.g., external) signal (and external pins) for selecting one of the address storage and comparison units (106X or 106Y). On other embodiments of the invention, a pair of counters may be used as the row and column address storage unit selectors 111X and 111Y.

Further, when one of the row address storage and comparison units 106X is selected, a separate address bit FAjP/FAjPB is generated using a separate address Aj to disable the column address storage and comparison units 106Y. The separate address bit FAjP/FAjPB enables either the row address storage unit selector 111X or the column address storage unit selector 111Y, to discriminate between performing a row repair or a column repair. This alternative is indicated by a connection line '/' in FIG. 4.

Figure 5:
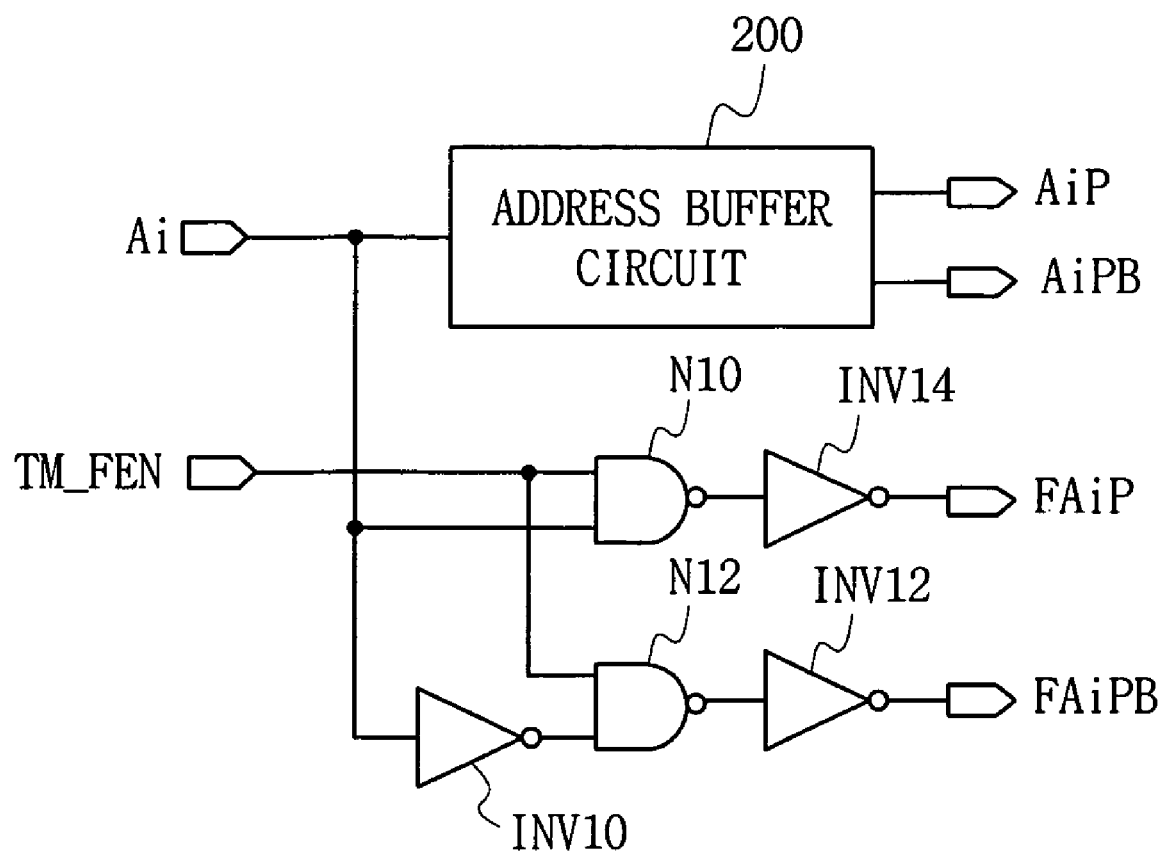
FIG. 5 is a detailed block diagram of the address buffer 112 in FIG. 3.

FIG. 5 is a block diagram of the address buffer 112 in FIG. 3.

Referring to FIG. 5, a combination of NAND-gates N10 and N12 and inverters INV10, INV12 and INV14 receives an external address XADD and an external redundancy circuit enable signal TM_FEN to generate second internal (failed cell) addresses FAiP and FAiPB based on the external address XADD. The address buffer circuit 200 for generating the first internal address AiP and AiPB may be a conventional address buffer circuit.

In order to allow redundancy programming (repairing) operation without affecting the normal operation of the semiconductor memory device, the second internal (failed cell) addresses FAiP and FAiPB are used for redundancy programming in the address comparing block (106 of FIG. 3). The second internal (failed cell) address FAiP is used as a data input for storage and comparison in address comparing block (106 of FIG. 3), and the second internal addresses are stored in the ferroelectric storage cells in the address comparing block 106. If the external redundancy circuit enable signal TM_FEN is low then even after the repair is completed and then the semiconductor memory device operates, the redundancy circuit does not perform a repair and does not affect the operation of the (repaired) device.

The low external redundancy circuit enable signal TM_FEN is applied when there is no defective cell. However, when there is a defective cell, the high external redundancy circuit enable signal TM_FEN is applied since a repair operation should be performed. When the external address XADD is high and the external redundancy circuit enable signal TM_FEN is high, the second internal (failed cell) FAiP becomes high and the second internal (failed cell) address FAiPB becomes low. The second internal (failed cell) addresses FAiP and FAiPB are used for programming (storing) in the address comparing block (106 of FIG. 3) as described above. The second internal (failed cell) address FAiP is used as the input data (failed address) to be stored in the address comparing block (106 of FIG. 3), and the (failed) addresses are stored in the non-volatile (e.g., ferroelectric) storage cells of the address comparing block 106. Following the repair, if the external redundancy circuit enable signal TM_FEN becomes low, then the programming lines of the redundancy circuit does not affect (e.g., slow down) the performance of the (repaired) semiconductor memory device.

Figure 6:
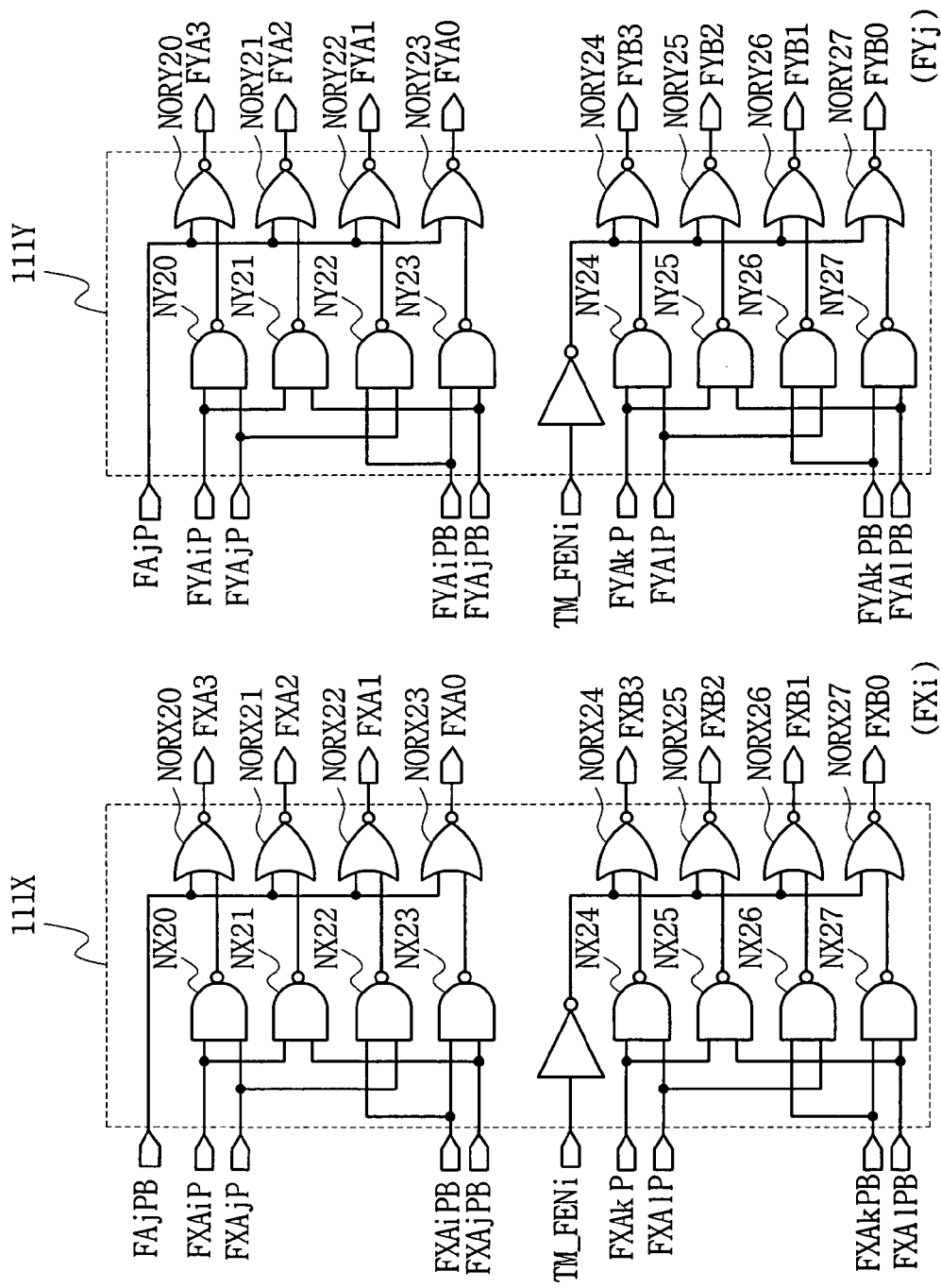
FIG. 6 is a detailed block diagram of the address storage unit selector 111 in FIG. 3.

FIG. 6 is a block diagram of the address storage unit selector 111 in FIG. 3.

The address storage unit selector (111 of FIG. 3) receives the second internal (failed cell) addresses FAiP and FAiPB (output by the address buffer 112 of FIG. 3), and the internal redundancy circuit enable signal TM_FENi (output by the control block 107 of FIG. 3 in response to receiving the external redundancy circuit enable signal TM_FEN), and selects one of the plurality of address storage and comparison units (106X or 106Y of FIG. 4).

In FIG. 6, the address storage unit selector (111 of FIG. 3) is shown as including a row address storage unit selector 111X and a column address storage unit selector 111Y. Further, the second internal (failed cell) addresses FAiP and FAiPB are shown as (failed) row cell addresses FXAiP, FXAiPB, FXAjP, FXAjPB, FXAkP, FXAkPB, FXAlP and FXAlPB and failed column cell addresses FYAiP, FYAiPB, FYAjP, FYAjPB, FYAkP, FYAkPB, FYAlP and FYAlPB, where each of i, j, k and l is one different number selected from 0,1,2, . . . ,n (for n+1 bits). The separate address bit signals FAjP and FAjPB are not used for programming but are used to select and enable one of the row address storage unit selector 111X and the column address storage unit selector 111Y during a programming mode. The address storage unit selector (111 of FIG. 3) selects one of the row address storage and comparison units (106X of FIG. 4) or one of the column address storage and comparison units (106Y of FIG. 4) in the address comparing block (106 of FIG. 3), such that either a row repair or a column repair is performed. The number of the row and column address storage and comparison units (106X and 106Y of FIG. 4) corresponds with the number of outputs (FX) of the row and column address storage unit selector (111X and 111Y of FIG. 4). The separate address bit signals FAjP and FAjPB that determine whether to perform a row or a column repair, and the internal redundancy circuit enable signal TM_FENi are input to the row and column address storage unit selectors (111X or 111Y of FIG. 6) to select the performance of a row or a column repair.

The operation of the address storage unit selector 111 of FIG. 3 will be described with reference to FIG. 6.

When one of the separate address bit signals FAjP and FAjPB becomes high, the other becomes low. They are complementary address signals. If the separate address bit FAjP is high, (and meanwhile the complementary separate address bit FAjPB becomes low), then the row address storage unit selector 111X is selected.

If the row second internal (failed cell) addresses FXAiP and FXAjP have one combination of high or low, the (row) second internal (failed cell) addresses FXAiPB and FXAjPB have an inverted (complementary) combination of the signals. The (row) second internal (failed cell) addresses FXAiP, FXAjP, FXAiPB and FXAjPB are input to the row address storage unit selector 111X.

The row address storage unit selector 111X is composed of NAND-gates NX20, NX21, NX22 and NX23 and NOR-gates NORX20, NORX21, NORX22 and NORX23, so that row address storage unit selection signals FXA0, FXA1, FXA2 and FXA3 are generated. As a result of the combination of the (row) second internal (failed cell) addresses FXAiP, FXAjP, FXAiPB and FXAjPB the row address storage unit selector 111X selects one row address storage unit.

Figure 7:
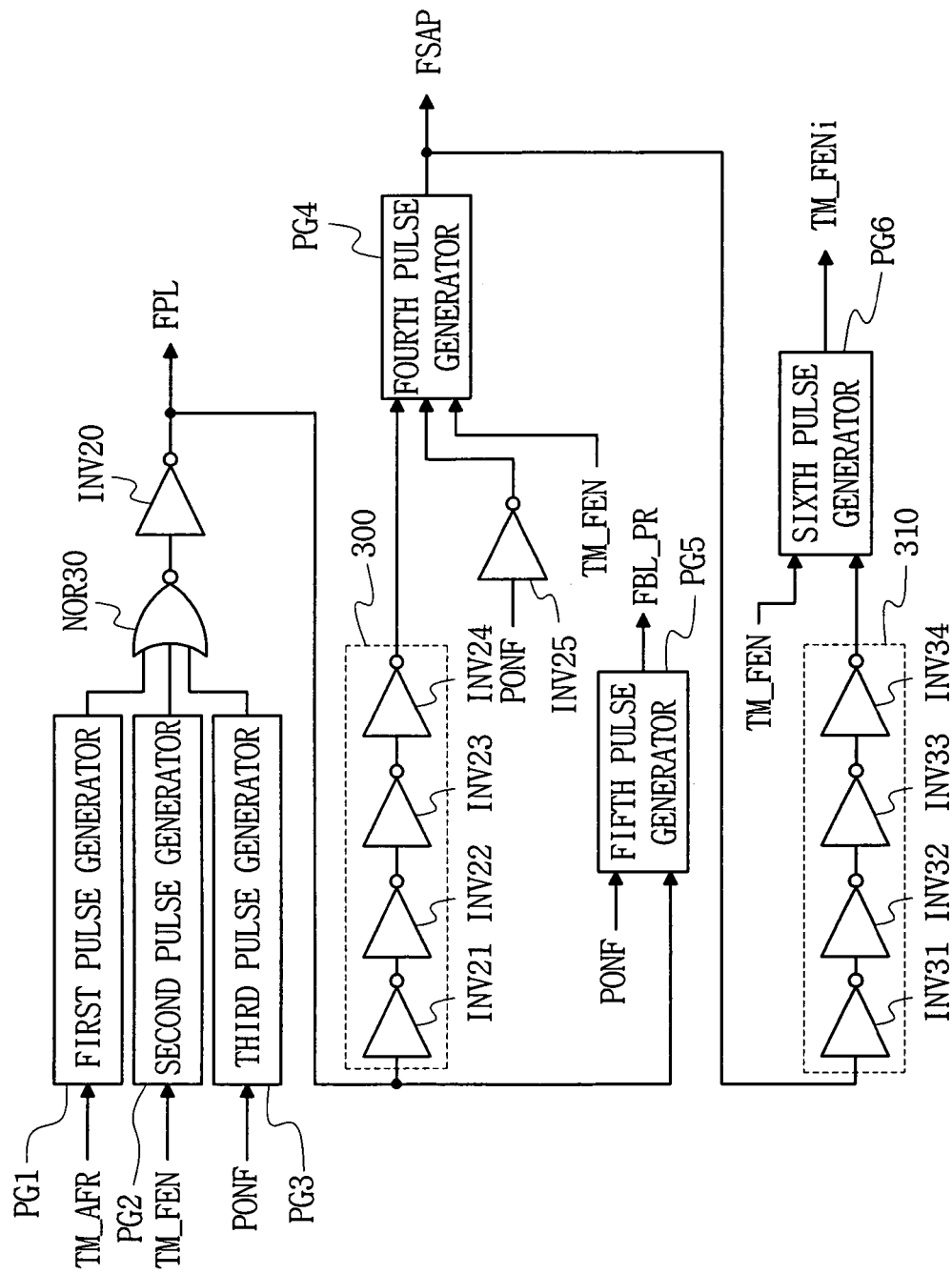
FIG. 7 is a detailed block diagram of the redundancy circuit control block 107 in the device of FIG. 3.

FIG. 7 is a block diagram of the control block 107 in FIG. 3.

Referring to FIG. 7, the control block (107) generates control signals, such as a plate pulse FPL, a sense amp enable signal FSAP, a bit line precharge signal FBL_PR, and an internal redundancy circuit enable signal TM_FENi.

The plate pulse FPL is used to activate the ferroelectric storage cells used in the master cells and in the address bit storage and comparison cells; and the sense amp enable signal FSAP is used to program address information in the master cells and in the address bit storage and comparison cells. The bit line precharge signal FBL_PR is used to precharge the bit lines (of the master cells and the address bit storage and comparison cells) to ground upon power-up, and the internal redundancy circuit enable signal TM_FENi is used for stable programming in the ferroelectric storage cells in the address comparing block (106 of FIG. 3). The NOR30 receives a pulse from a first pulse generator PG1 responsive to a external redundancy circuit reset signal TM_AFR, a pulse from a second pulse generator PG2 responsive to an external redundancy circuit enable signal TM_FEN, and a pulse from a third pulse generator PG3 responsive to a power on/off signal PONF, and generates a NOR output. The INV20 inverts the NOR output to generates the plate pulse FPL. Thus, the NOR output is generated by the NOR-gate NOR30, and the inverted version of the NOR output from the NOR-gate NOR30 is generated by the inverter INV 20.

The plate pulse FPL is enabled during each of the following: when power is on (a power-up mode); when all the address storage and comparison units (106X and 106Y of FIG. 4) are disabled prior to testing the main cell (a redundancy circuit reset mode); when address information specifying the defective cell is stored in the address bit storage and comparison cells and the defective main memory cell is repaired (a repair mode); and when a particular address storage and comparison unit is disabled (e.g., in the case where its associated redundancy cell is failed (e.g., defective) or in the case where the whole address comparing block (106 of FIG. 3) is not used for repairing (a repair disable mode).

In the reset mode, the external redundancy circuit reset signal TM_AFR (an address storage unit reset signal) is active and, in turn, the plate pulse FPL is asserted such that the ferroelectric storage cells of the master cells function to initialize the address comparing block (106 of FIG. 3) by storing the unit-disable information in the ferroelectric storage cells of master cells. All the address storage and comparison units (106X and 106Y of FIG. 3) are required to be initialized or disabled (e.g., to disable the redundancy memory array) prior to main memory cell testing and repair programming so that the redundancy circuit and the redundancy cell array does not interfere with testing of the main memory cell array and so that the address storage and comparison unit(s) that is/are ultimately not used for repairing does not operate following the repair.

In the repair mode, the plate pulse FPL is enabled in response to the external redundancy circuit enable signal TM_FEN, such that the ferroelectric storage cells of the master cells and of the address bit storage and comparison cells may be accessed (e.g., programmed). It is intended to program (store) an address specifying a defective cell (i.e., a failed cell address) into the ferroelectric storage cell(s) in a plurality of address bit storage and comparison cell of one address storage and comparison units (e.g., 106X of FIG. 8) by selecting one of the address storage and comparison units initialized during the reset mode in response to the external redundancy circuit enable signal TM_FEN.

In the repair disable mode, the external redundancy circuit enable signal TM_FEN enables the plate pulse FPL to operate the ferroelectric storage cell(s) and enables an address storage and comparison unit (e.g., 106X or 106Y) in the address comparing block (106) to be selected. Unit-disable information is stored in the master cell of the selected address storage and comparison unit (e.g., 106X or 106Y), for example, when there is a defect in the associated redundancy array cell initially used for making a repair. Then, when the same (internal) address as the programmed (stored) address is input to the address comparing block (106 of FIG. 3) following the second repair, the input address is accesses another redundancy cell, not the defective redundancy cell.

Further, in order to make the access time into the redundancy cell(s) to be the same as the access time into the main cell(s), it is required to prefetch (e.g., latch) the stored address information in the ferroelectric storage cells in the address storage and comparison units (106X and 106Y) in the address comparing block (106 of FIG. 3). For this reason, when power is turned on and reaches a predetermined level, the ferroelectric storage cells operate in response to a power on/off signal PONF from the power sensor. Thus, when the power on/off signal PONF is high, the plate pulse FPL is enabled.

The redundancy circuit control block (107 of FIG. 3) is configured so that the sense amp enable signal FSAP is enabled a predetermined time after the plate pulse FPL is generated upon power-up. Thus, a first delay circuit 300 composed of inverters INV21, INV22, INV23 and INV24 delays the plate pulse FPL which will be input to a fourth pulse generator PG4. The fourth pulse generator PG4 receives a delayed version of the plate pulse FPL, an inverted version of the power on/off signal PONF from an inverter INV25 and the external redundancy circuit enable signal TM_FEN and generates the sense amp enable signal FSAP.

After the (stored) address and unit-disable information is read (from the ferroelectric storage cells) and latched, it remains unchanged while the semiconductor memory device operates. The sense amp enable signal FSAP remains enabled until the power is off, allowing a comparison of the stored address information to a new address that is input to the semiconductor memory device. Further, the plate pulse FPL is enabled after the sense amp enable signal FSAP is disabled in response to the external redundancy circuit enable signal TM_FEN to provide stable programming during repairing. The plate pulse FPL is enabled again after a predetermined time has elapsed.

In the power-up mode, to prevent loss of the programmed (Stored) address information stored in the ferroelectric storage cells, the bit line precharge signal FBL_PR is enabled in response to the power on/off signal PONF. The bit line precharge signal FBL_PR is disabled in response to the plate pulse FPL before the stored address information in the ferroelectric storage cells of the address comparing block (106 of FIG. 3) is read. Here, a fifth pulse generator PG5 generates the bit line precharge signal FBL_PR in response to the power on/off signal PONF and the plate pulse FPL.

In the repair mode, the external redundancy circuit enable signal TM_FEN is used. When the generation of the second internal (failed cell) address FAiP and the programming of the address comparing block (106 of FIG. 3) are simultaneously performed in response to the external redundancy circuit enable signal TM_FEN, the second internal (failed cell) address FAiP becomes low due to the disabled external redundancy circuit enable signal TM_FEN, and accordingly, erroneous (failed address) information may be stored in the address bit storage and comparison cells of the address comparing block (106 of FIG. 3). To prevent this, the internal redundancy circuit enable signal TM_FENi should be disabled earlier than the external redundancy circuit enable signal TM_FEN. Accordingly, the internal redundancy circuit enable signal TM_FENi is enabled by the external redundancy circuit enable signal TM_FEN and disabled a predetermined time after the sense amp enable signal FSAP is enabled. It is possible to program the ferroelectric storage cells in the master cells and in the address bit storage and comparison cells with higher stability by using the internal redundancy circuit enable signal TM_FENi in the address comparing block (106 of FIG. 3).

Figure 8:
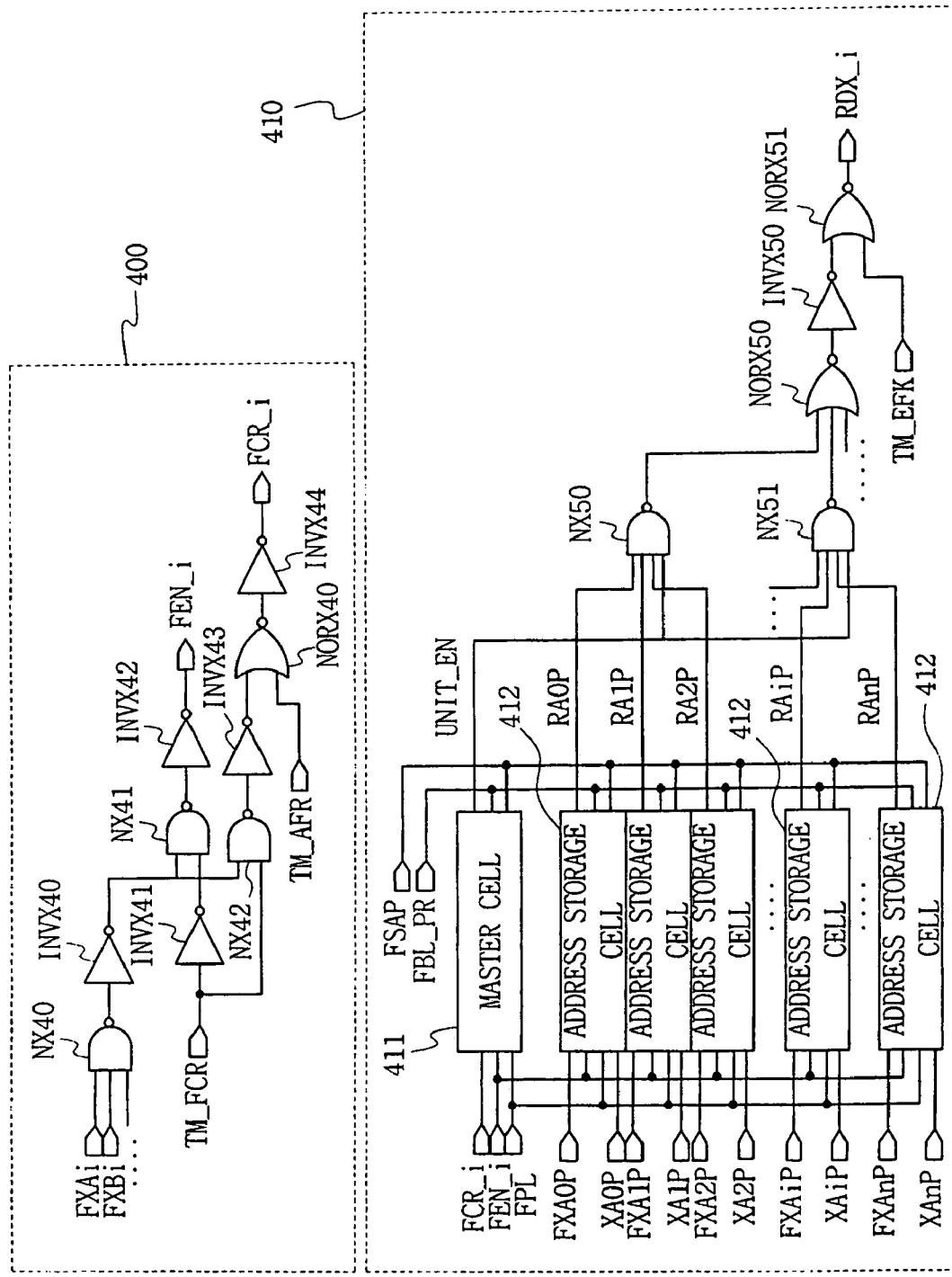
FIG. 8 is a detailed block diagram of a row address storage and comparison unit 106X in FIG. 4.

FIG. 8 is a block diagram of the row address storage and comparison unit 106X in FIG. 4.

Referring to FIG. 8, the row address comparing block is composed of a drive circuit_X 400 and a content addressable memory (CAM) word circuit_X 410.

The drive circuit_X 400 generates an internal programming enable signal FEN_i or an internal repair disable signal FCR_i in response to a row decoding signal FXAi/FXBi/..., an external repair disable signal TM_FCR, and a external redundancy circuit reset signal TM_AFR.

The content addressable memory (CAM) word circuit_X 410 is composed of a master cell 411, a plurality of address bit storage and comparison cells 412, NAND-gates NX50 and NX51, NOR-gates NORX50 and NORX51, and an inverter INVX50. A combination of the NAND-gates NX50 and NX51, NOR-gates NORX50 and NORX51 and an inverter INVX50 compares the stored address information in the address bit storage and comparison cells 412 to an input address, and when the addresses are the same, generates a row redundancy decoder enable signal RDX_i for enabling the row redundancy decoder (104 of FIG. 3). In particular, RDX_i is a row redundancy decoder enable signal among the redundancy decoder enable signals RDAi of FIG. 3.

Altogether, the row address storage and comparison unit (106X of FIG. 4) generates an internal programming enable signal FEN_i in response to the row decoding signal FXAi/FXBi/... from the row address storage unit selector 111X. Further, the internal programming enable signal FEN_i enables programming in the selected row address storage and comparison unit (106X of FIG. 4). The repairing is accomplished by programming the master cell 411 and the address bit storage and comparison cells 412 in the selected row address storage and comparison unit 106X. Further, the row decoding signal FXAi/FXBi/... and the external repair disable signal TM_FCR are used to program (store) the unit-disable information in the master cell 411 of the selected row address storage and comparison unit 106X; and the external redundancy circuit reset signal TM_AFR is used to program the unit-disable information in the master cells in all the row and column address storage and comparison units (106X and 106Y of FIG. 4). Further, the external redundancy circuit disable signal TM_EFK is used to (temporarily) disable the row and column redundancy decoder enable signals RDX_i and RDY_i that are output from all the row and column address storage and comparison units so that all the redundancy decoders (104 of FIG. 3) do not operate. The address bit storage and comparison cells 412 store bits of the row address information and store repair or read the stored address information. The row address storage and comparison unit 106X is reset or disabled in response to the plate pulse FPL from the control block (107 of FIG. 3), the sense amp enable signal FSAP, the bit line precharge signal FBL_PR, the external repair disable signal TM_FCR, the external redundancy circuit reset signal TM_AFR, and the external redundancy circuit disable signal TM_EFK.

The master cell 411 receives the internal programming enable signal FEN_i or the internal repair disable signal FCR_i to program unit-enable or unit-disable information in its internal ferroelectric storages cells. During the normal operation of the semiconductor memory device, a the row address storage and comparison unit 106X is enabled or disabled depending on the unit's compare enable signal UNIT_EN, which is generated by reading and latching the unit-enable or unit-disable data stored in the master cell 411.

Each address bit storage and comparison cell 412 stores one bit of the second internal (failed cell) addresses FAiP and FXAIP from the address buffer (112 of FIG. 3) in its internal ferroelectric storage cells (FC3 and FC4 of FIG. 11) in response to the row second internal (failed cell) address specifying a defective cell in the memory cell array and the external redundancy circuit enable signal TM_FEN. The stored row address information in the address bit storage and comparison cells 412 is later prefetched (and latched) when the power is turned on, and is compared with the row address that is input and buffered by the address buffer (the first internal address) while the semiconductor memory device operates. If the address bit storage and comparison cell 412 receives the same row address as the stored address in the address bit storage and comparison cell 412, i.e., if the input row addresses XA0P, XA1P, ..., XAiP are the same as the stored address in the address bit storage and comparison cells 412, the address bit storage and comparison cells 412 outputs high comparison signals RA0P, RA1P, ..., RAiP. Here, XAOP, XA1P, ..., XAiP indicate the row addresses of the internal address AiP in FIG. 3. In the NAND-gates NX50 and NX51, the match signals RA0P, RA1P, ..., RAiP are subject to NAND operation and become low. In the NOR-gate NORX50, the low output is subject to the NOR operation and becomes high. In the inverter INVX50, the high output from the NOR-gate NORX50 is inverted to low. When the redundancy circuit disable signal TM_EFK is low, the row redundancy decoder enable signal RDX_i becomes high through the NOR-gate NORX51. The row redundancy decoder enable signal RDX_i disables the main row predecoder or the main decoder. Also, the redundancy row decoder operates, thus row repairing.

Figure 9:
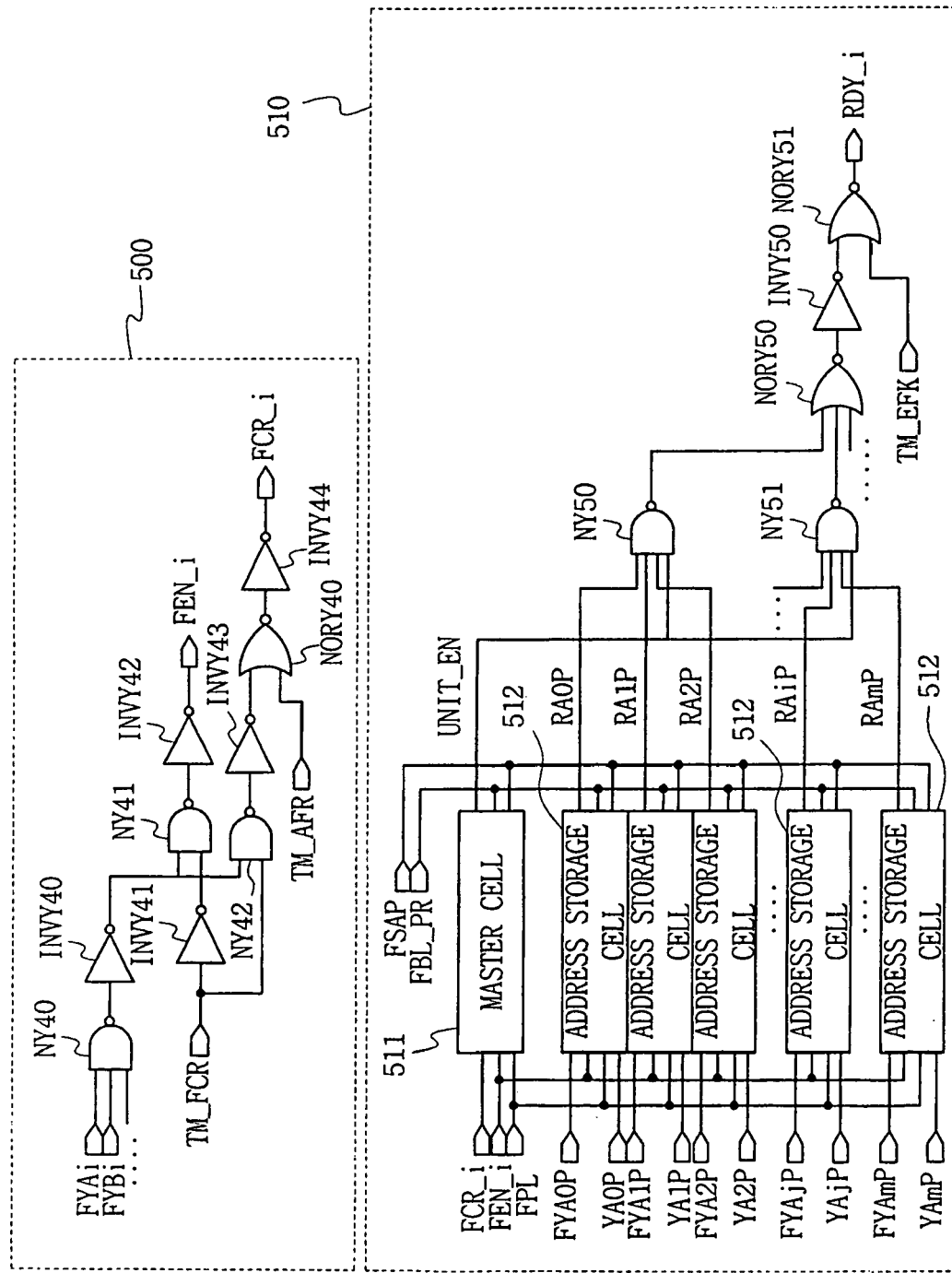
FIG. 9 is a block diagram of a column address storage and comparison unit 106Y in FIG. 4.

FIG. 9 is a block diagram of a column address storage and comparison unit 106Y in FIG. 4.

Referring to FIG. 9, the column address storage and comparison unit 106Y is composed of a drive circuit_Y 500 for generating an internal programming enable signal FEN_i and an internal repair disable signal FCR_i in response to a column decoding signal FYAi/FYBi/... and TM_FCR and TM_AFR signals; and a content addressable memory (CAM) word circuit_Y 510 having a master cell 511, a plurality of address bit storage and comparison cells 512, an inverter INVY50 for comparing the stored address information in the address bit storage and comparison cell 512 to an input address and generating a column redundancy decoder enable signal RDY_i for enabling the column redundancy decoder when the two addresses are the same, NAND-gates NY50 and NY51, and NOR-gates NORY50 and NORY51. The drive circuit_Y 500 of the address storage and comparison unit 106Y generates an internal programming enable signal FEN_i in response to the column decoding signal FYAi/FYBi/... from the column address storage and comparison unit selector 111Y. The internal programming enable signal FEN_i is used to enable the selected one of the plurality of column address storage and comparison units (106Y of FIG. 4). In the selected column address storage and comparison unit, the master cell 511 and the address bit storage and comparison cells 512 are programmed, such that the repairing is performed. Further, in response to the external repair disable signal TM_FCR and the column decoding signals FYAi, FYBi, ..., the unit-disable information may be programmed (stored) in the master cell 511 of the selected column address storage and comparison unit 106Y. In response to the external redundancy circuit reset signal TM_AFR, the unit-disable information may be programmed (stored) in the master cells 511 of all the row and column address storage and comparison units. In response to the redundancy circuit disable signal TM_EFK, the row and column redundancy decoder enable signals RDX_i and RDY_i that are outputs of all the row and column address storage and comparison units (106X and 106Y of FIG. 4) are disabled so that the redundancy decoder 104 does not operate.

The master cell 511 and the address bit storage and comparison cells 512 write or read information to set (program) the column address storage and comparison unit (106Y of FIG. 4) in response to the plate pulse FPL from the control block (107 of FIG. 3), the sense amp enable signal FSAP, the bit line precharge signal FBL_PR, and the external repair disable signal TM_FCR, the external redundancy circuit reset signal TM_AFR, and the external redundancy circuit disable signal TM_EFK.

The master cell 511 stores unit-enable or unit-disable information in its internal ferroelectric storage cells (FC1 and FC2 of FIG. 10) in response to the internal programming enable signal FEN_i and the internal repair disable signal FCR_i, respectively.

When the semiconductor memory device operates, a unit's compare enable signal UNIT_EN determines whether the column address storage and comparison unit (106Y of FIG. 4) is enabled or disabled based on the data stored in the ferroelectric storage cells (FC1 and FC2 of FIG. 10) of the master cell of that column address storage and comparison unit.

Each address bit storage and comparison cell 512 stores one bit of the second internal (failed cell) addresses FAiP and FYAiP received from the address buffer in its two (complementary) ferroelectric storage cells (FC3 and FC4 of FIG. 11) in response to the column address that specifies the defective cell and the external redundancy circuit enable signal TM_FEN. The programmed (stored) bit of column address information in the address bit storage and comparison cell 512 is prefetched (and latched) when the power is on; and when the semiconductor memory device operates the stored bit of column address information is compared with the column address that is being input.

If when the semiconductor memory device operates the address bit storage and comparison cells 512 receive the same column address as the address stored in the address bit storage and comparison cells 512, (i.e., if the input column addresses YA0P, YA1P, ..., YAiP are the same as the stored address in the address bit storage and comparison cell 512s), the address bit storage and comparison cells 512 output high comparison signals RA0P, RA1P, ..., RAiP. Here, YA0P, YA1P, ..., YAiP indicate column addresses of the internal addresses AiP in FIG. 3. In the NAND-gates NY50 and NY51, the comparison signals RA0P, RA1P, ..., RAiP are subject to NAND operation and become low. In the NOR-gate NORY50, the low output is subject to the NOR operation and becomes high. In the inverter INVY50, the high output from the NOR-gate NORY50 is inverted to low. When the redundancy circuit disable signal TM_EFK is low, the column redundancy decoder enable signal RDY_i becomes high through the NOR-gate NORY51. The column redundancy decoder enable signal RDY_i disables one of the main row predecoder or the main decoder. Also, the redundancy column decoder operates, thus column repairing.

Figure 10:
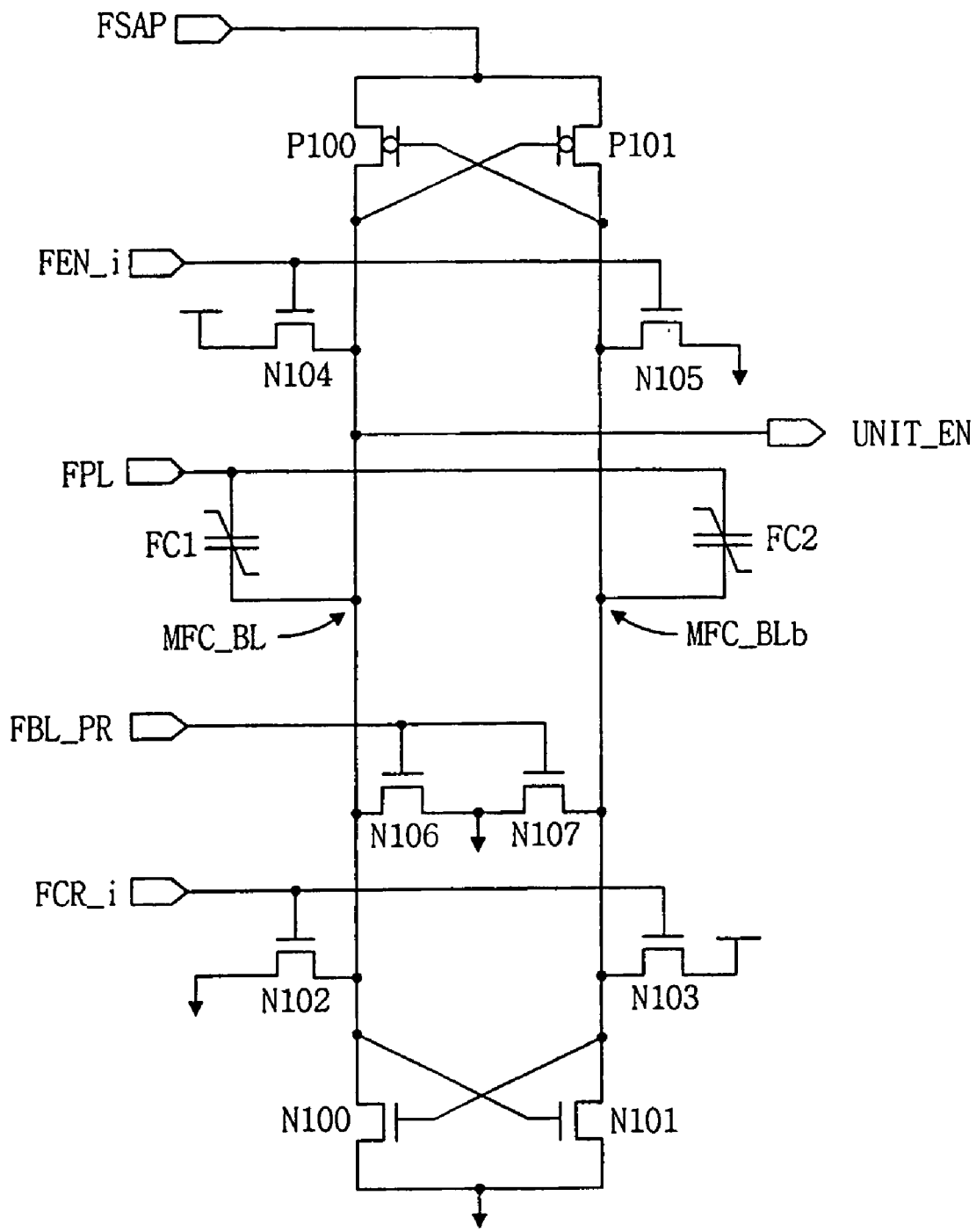
FIG. 10 is a circuit diagram of a master cell (411 and 511) of the row and column address storage and comparison units 106X and 106Y in FIGS. 8 and 9.

FIG. 10 is a circuit diagram of a master cell (411 and 511) of FIGS. 8 and 9.

Referring to FIG. 10, a master cell (411 or 511) is composed of a combination of two ferroelectric storage cells FC1 and FC2, PMOS transistors P100 and P101, and NMOS transistors N100, N101, N102, N103, N104, N105, N106 and N107.

Unit-enable and unit-disable information is stored in the ferroelectric storage cells FC1 and FC2 of the master cell.

The PMOS transistors P100 and P101 and the NMOS transistors N100 and N101 are configured in the form of a latch, allowing information to be stored in the ferroelectric storage cells FC1 and FC2 or the stored information to be read.

The NMOS transistors N104 and N105 input the enable information into the address storage and comparison unit (106X or 106Y of FIG. 4) to master bit lines MFC_BL and MFC_BLb in response to the internal programming enable signal FEN_i.

The NMOS transistors N102 and 103 input the disable information to the master bit line MFC_BL/MFC_BLb in response to the internal repair disable signal FCR_i.

The NMOS transistors N106 and N107 allow the bit line to be precharged to a ground voltage in response to the bit line precharge signal FBL_PR upon power up. The bit line precharge signal FBL_PR is enabled in response to the power on/off signal PONF and disabled in response to the plate pulse FPL before the programmed (stored) address information in the ferroelectric storage cells FC1 and FC2 is read.

The master cell receives the plate pulse FPL, the sense amp enable signal FSAP, the internal programming enable signal FEN_i, the internal repair disable signal FCR_i, and the bit line precharge signal FBL_PR, and stores enable or disable information of the address storage and comparison unit (106X or 106Y of FIG. 4) in the internal ferroelectric storage cells FC1 and FC2 of the master cell (411 or 511). In the operation of the semiconductor memory device, the information stored in the ferroelectric storage cells FC1 and FC2 of a master cell is input to the master bit lines MFC_BL and MFC_BLb, so that the unit's compare enable signal UNIT_EN is output. The output of each address storage and comparison unit (106X or 106Y of FIG. 4) is controlled by the unit's compare enable signal UNIT_EN.

As shown in FIGS. 8 and 9, the unit's compare enable signal UNIT_EN in a high state is needed to enable the output of the address storage and comparison unit 106Y. In response to the internal programming enable signal FEN_i, the master bit lines MFC_BL and MFC_BLb become high and low, respectively. In response to the master bit lines MFC_BL and MFC_BLb respectively in the high and low states, the ferroelectric storage cell FC1 stores high information and the ferroelectric storage cell FC2 stores low information. The thus stored unit-enable information is output as a high compare enable signal UNIT_EN via the latch, which is composed of the NMOS transistors N100 and N101 and the PMOS transistors P100 and P101, according to the plate pulse FPL from the control block (107) and the sense amp enable signal FSAP when the power is on. The high compare enable signal UNIT_EN enables the address storage and comparison unit 106Y by controlling the NAND-gates NX50 and NX51 that NANDs the outputs of the plurality of address bit storage and comparison cells 412. To prevent malfunction of any address storage and comparison unit 106Y that is not used for repairing, the internal repair disable signal FCR_i, generated by the external repair disable signal TM_FCR and the external redundancy circuit reset signal TM_AFR, initializes the address storage and comparison units (106X or 106Y of FIG. 4) by inputting the disable information into the master cells of the address storage and comparison units (106X or 106Y of FIG. 4). The internal repair disable signal FCR_i allows low and high information to be stored in the ferroelectric storage cell FC1 and the ferroelectric storage cell FC2, respectively and the low compare enable signal UNIT_EN is output so that the address storage and comparison unit (106X or 106Y of FIG. 4) is disabled and does not operate when the semiconductor memory device operates.

Figure 11:
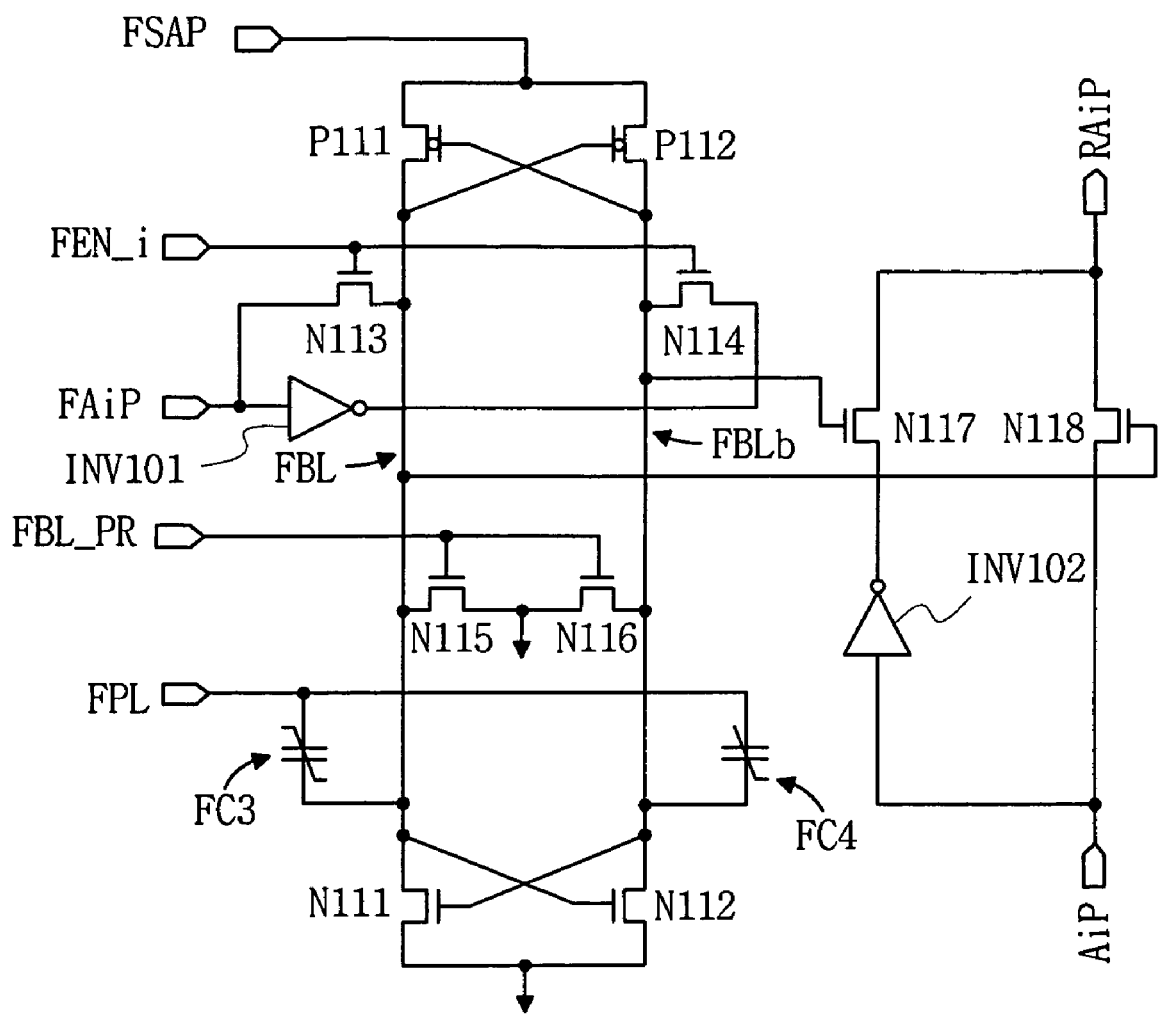
FIG. 11 is a circuit diagram of an address bit storage and comparison cell (412 or 512) of row and column address storage and comparison units 106X and 106Y in FIGS. 8 and 9.

FIG. 11 is a circuit diagram of an address bit storage and comparison cell 412 or 512 in the address storage and comparison unit 106X or 106Y of FIGS. 8 and 9.

Referring to FIG. 11, the address bit storage and comparison cell (412 or 512) includes two ferroelectric storage cells FC3 and FC4, a latch, NMOS transistors N113, N114, N115, N116, N117 and N118, and inverters INV101 and INV102.

The two ferroelectric storage cells FC3 and FC4 store one bit of (failed address) information that will be input to the address storage and comparison unit (106X or 106Y of FIG. 4) via the second (failed cell) internal address bus.

The latch is composed of a pair of PMOS transistors P111 and P112 and a pair of NMOS transistors N111 and N112, and serves to store information in the ferroelectric storage cells FC3 and FC4 and to read the stored information from them.

The NMOS transistors N113 and N114 input a second internal (failed cell) address FAiP as (failed address) information to the ferroelectric storage cells FC3 and FC4 in response to an internal programming enable signal FEN_i.

The inverter INV101 serves to make the second internal (failed cell) address FAiP applied to a main bit line FBL and a reference bit line FBLb to have different states.

The inverter INV102 serves to make the first internal address AiP to have two different states so that the first internal address AiP is compared to the stored (second internal address) address information in the ferroelectric storage cells FC3 and FC4.

The NMOS transistors N117 and N118 connect or disconnect a path for the first internal address AiP having two states according to the programmed (stored, second internal address) address information in the ferroelectric storage cells FC3 and FC4.

The NMOS transistors N115 and N116 precharge the bit lines FBL and FBLb to a ground voltage in response to the bit line precharge signal FBL_PR upon power-up.

The address bit storage and comparison cell receives a plate pulse FPL, a sense amp enable signal FSAP and an internal programming enable signal FEN_i and stores one bit of the address information of a defective main memory cell in the internal ferroelectric storage cells FC3 and FC4 or reads and compares the stored (failed) address information to an input (first internal address) address to determine whether the two addresses are the same. In other words, the repair process of programming the (second internal) address information in the address bit storage and comparison cell is performed as the two (complementary) states of the second internal (failed cell) address, which is output from the address buffer in response to the external redundancy circuit enable signal TM_FEN, are input to the bit lines FBL and FBLb, respectively, in response to the internal programming enable signal FEN_i and stored in the ferroelectric storage cells FC3 and FC4. The ferroelectric storage cells FC3 and FC4 output the stored (second internal) address information in response to the plate pulse FPL upon power-on and the latch senses the (failed address) information stored in the ferroelectric storage cells.

If the bit of failed address information stored in the address bit storage and comparison cell (412 or 512) and the corresponding bit of first internal address AiP (input when the semiconductor memory device operates) are both high (e.g., the same), the NMOS transistor N118 connected to the first internal address AiP is turned on and a high (match) signal RAiP is output. If the stored bit of failed address information and the first internal address AiP are both low (e.g., the same), then the NMOS transistor N118 connected to the first internal address AiP is turned off and the NMOS N117 connected to the inverted version of the internal address AiP is turned on, such that a high (match) signal RAiP is output. If the bit of failed address information stored in the address bit storage and comparison cell is different from the corresponding bit of the first internal address AiP, then the NMOS transistor N118 connected to the first internal address AiP is turned off and the NMOS transistor N117 connected to an inverted version of the internal address AiP is turned on, such that a low signal RAiP is output. Thus, if the stored bit of second internal (failed cell) address information and the corresponding bit of input first internal address AiP are the same, a high signal RAiP is output and, otherwise, a low signal RAiP is output.

Referring to FIGS. 3 to 11, the invention provides a redundancy circuit for generating a redundancy decoder enable signal RDAi (e.g., RDX_i or RDY_i) in response to an input (internal) address (without using physical fuses for redundancy programming), when the internal address indicates a defective one of the memory cells in a main memory cell array of a semiconductor memory device. The redundancy circuit comprises a plurality of address storage and comparison units (106X and 106Y of FIG. 4) each having a non-volatile master cell 411 and a plurality of non-volatile address bit storage and comparison cells 412 connected to the master cell 411, the plurality of the address bit storage and comparison cells corresponding to bits of the address. When the master cell 411 is activated, the redundancy decoder enable signal RDAi (e.g., RDX_I or RDY_i) responsive to an failed main memory cell address (that is input and stored via a second internal (redundancy) address path (used only during a repair operation) is output via the corresponding address bit storage and comparison cells 412.

A redundancy circuit control block (107) applies control signals to the address comparing block 106 and to the storage unit selector 111 in response to external signals and status signals (e.g., applied during the repair operation). The external signals include the external redundancy circuit reset signal TM_AFR, the external repair disable signal TM_FCR, the external redundancy circuit disable signal TM_EFK. The status signals include the power on/off signal PONF. The control signals include the plate pulse FPL, the sense amp enable signal FSAP, the bit line precharge signal FBL_PR.

Figure 12:
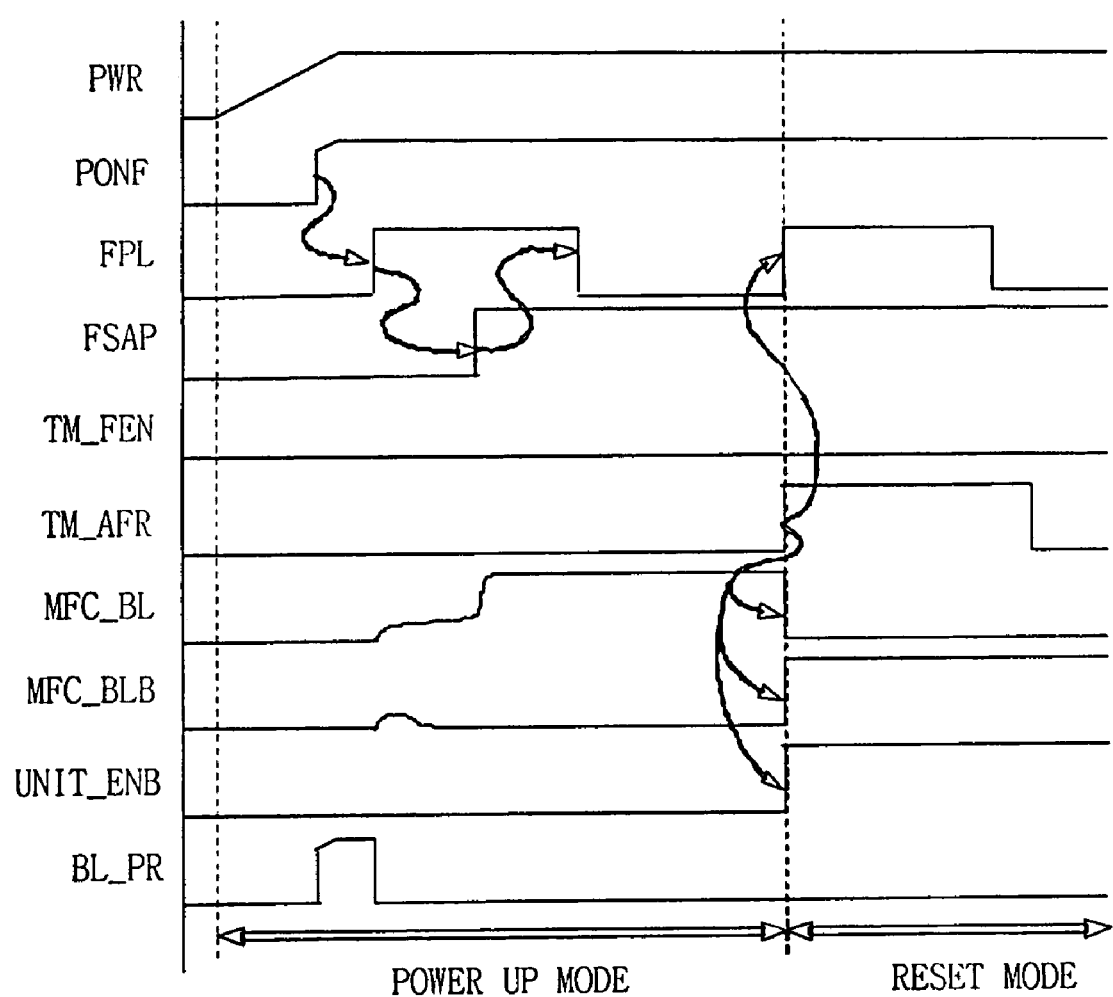
FIG. 12 is a timing diagram illustrating a power-up mode and a reset mode of the redundancy circuit of the device of FIG. 3.

FIG. 12 is a timing diagram illustrating a power-up mode and a reset mode of the device of FIG. 3. The reset mode is an initialization mode for initializing all address storage blocks prior to repairing.

Referring to FIGS. 3 and 12, in the power-up mode, when the power is on and reaches a predetermined level, the power sensor 108 outputs a power on/off signal PONF. The power on/off signal PONF allows the redundancy circuit control block 107 to generate the plate pulse FPL. In response to the plate pulse FPL, the unit-enable or unit-disable information stored in the ferroelectric storage cells FC1, FC2 of the master cells (411 of FIG. 8 and 511 of FIG. 9) are output to the bit lines MFC_BL, MFC_BLb; and the address information stored in the address bit storage and comparison cells (412 of FIG. 8 and 512 of FIG. 9), are output to the bit lines FBL and FBLb. The latches pre-sense, latch and amplify the stored unit-enable or unit-disable information and the stored (failed cell) address information in response to the sense amp enable signal FSAP. To prevent loss of the information stored in the ferroelectric storage cells FC1, FC2, FC3 and FC4, the bit lines MFC_BL, MFC_BLb, FBL, and FBLb are precharged to a ground voltage in response to the bit line precharge signal FBL_PR after the power on/off signal PONF is enabled and before the plate pulse FPL is enabled. As such, the address comparing block 106 pre-fetches (and latches) the stored repair (address and unit enable) information (e.g., stored failed address information) upon power on and prepares the redundancy circuit, which makes it possible to reduce a time to drive the redundancy array cells through a comparison of the input address to the stored address.

In the reset mode, the disable information is programmed (stored) in the master cell (411 of FIG. 8) in response to the external redundancy circuit reset signal TM_AFR so that master cells in all the address storage and comparison units (106X and 106Y of FIG. 4) are initialized. This allows only those address storage and comparison units selected by the selection signal(s) (from the address storage unit selector 111) to operate during a repair and, after the repair, prevents the malfunction of any address storage and comparison units (106X and 106Y of FIG. 4) that are not intended to be used for repairing.

Figure 13:
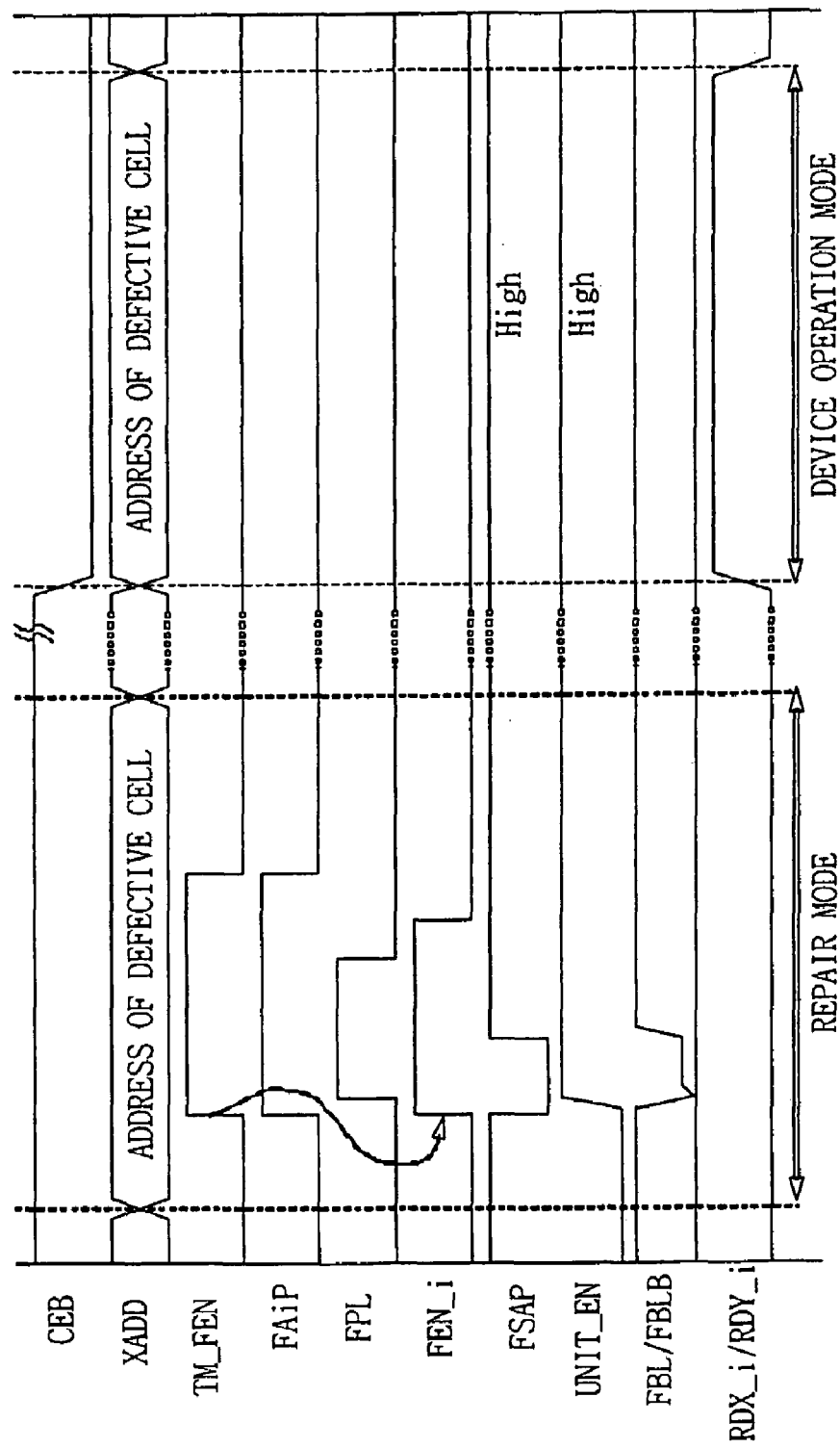
FIG. 13 is a timing diagram illustrating a repair result in a repair mode and a normal operation mode of the device of FIG. 3.

FIG. 13 is a timing diagram illustrating a repair result in a repair mode and a normal operation mode of FIG. 3.

Referring to FIGS. 3 and 13, in the repair mode, one address storage and comparison unit (106X or 106Y) is selected to store the address that specifies a defective main memory cell. The external redundancy circuit enable signal TM_FEN is high, and repair information is programmed (stored) in the master cell (411 of FIG. 8 or 511 of FIG. 9) and the address bit storage and comparison cells (412 of FIG. 8 or 512 of FIG. 9) in the selected address storage and comparison unit (106X or 106Y) in the address comparing block 106. In response to the external redundancy circuit enable signal TM_FEN, each address bit storage and comparison cell may be programmed under control of the internal programming enable signal FEN_i using only the plate pulse FPL and the second internal (failed cell) address FAiP (the address specifying the defective cell) without inputting separate repair information data. It is possible to achieve more stabilized programming by disabling the sense amp enable signal FSAP for a predetermined period of time. Additionally, erroneous information is prevented from being stored in the address comparing block by allowing the internal programming enable signal FEN_i to be disabled earlier than the second internal (failed cell) address FAiP and the external redundancy circuit enable signal TM_FEN (e.g., in response to the disabling of the internal redundancy circuit enable signal TM_FENi from the redundancy control block 107 of FIG. 7).

In the normal mode of semiconductor memory device operation, to allow continuous operation of the semiconductor memory device after the repair(s), the sense amp enable signal FSAP remains enabled (e.g., high, at the supply voltage) so that the latch continues to latch the prefetched stored information. In the normal operation of the device following the repair(s), when the address specifying the defective main memory cell is input, the address comparing block enables the redundancy decoder enable signals RDX_i and RDY_i. The redundancy decoder enable signals RDX_i and RDY_i enable the redundancy decoder and disable the main decoder so that the redundancy cell in the redundancy cell array 103 is substituted for the defective cell in the main cell array 102.

Figure 14:
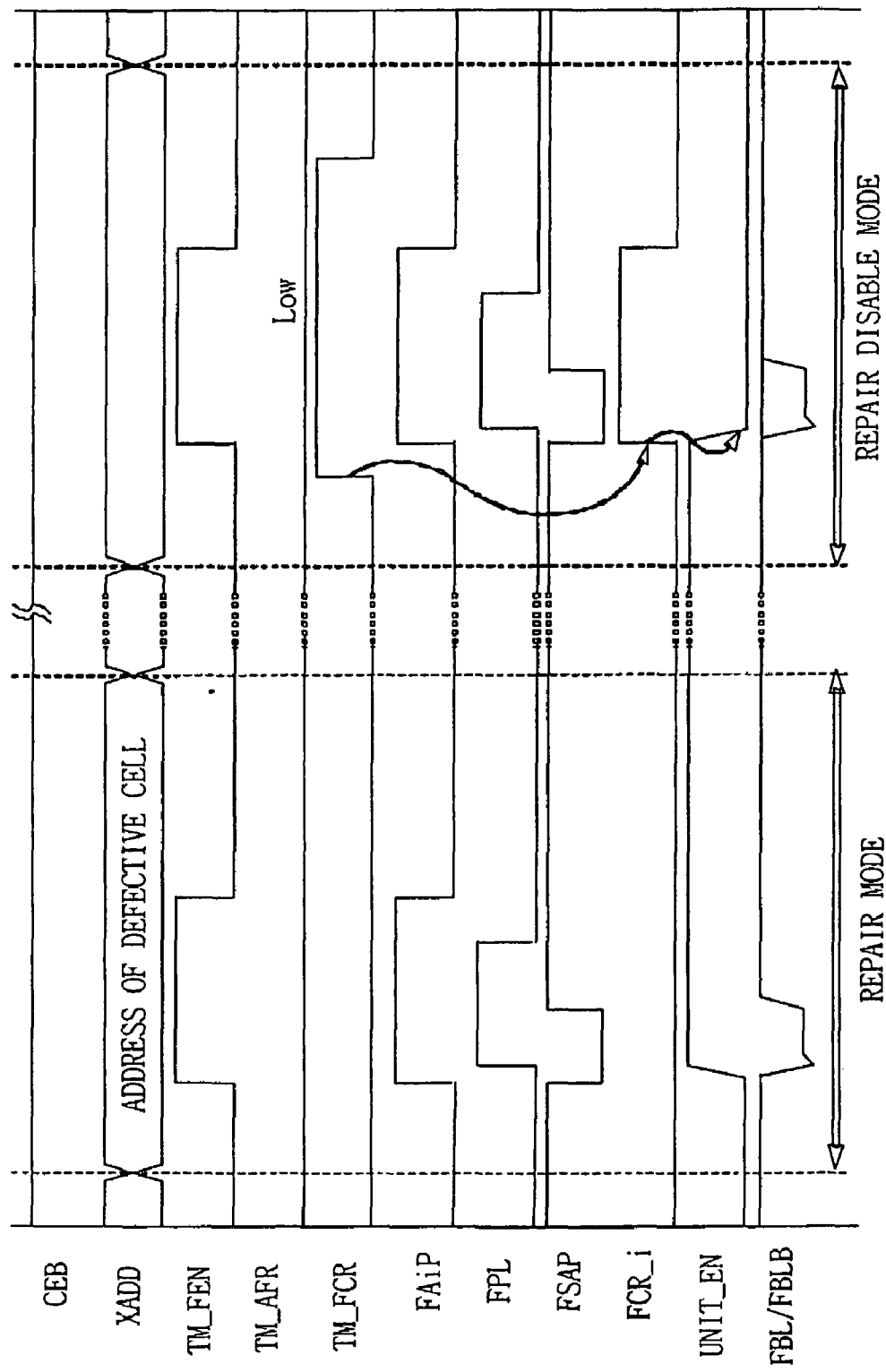
FIG. 14 is a timing diagram illustrating a repair mode and a redundancy circuit disable mode of the device of FIG. 3.

FIG. 14 is a timing diagram illustrating a repair mode and a repair disable mode in which the redundancy circuit (e.g., the address comparing block 106 in FIG. 3) used for repairs is disabled.

When a redundancy array cell is determined to be defective (e.g., by testing following an initial repair), the corresponding address storage and comparison unit is disabled and repair is repeated using another address storage and comparison unit. Accordingly, the address storage and comparison unit corresponding with the defective redundancy array cell among the plurality of address storage and comparison units (106X and 106Y of FIG. 4) may be selectively disabled using the external repair disable signal TM_FCR and the internal repair disable signal FCR_i generated by an address that selects the address storage and comparison unit, as shown in FIG. 14. After a prior repair is disabled, another address storage and comparison unit may be selected so that the repair may be repeated.

Figure 15:
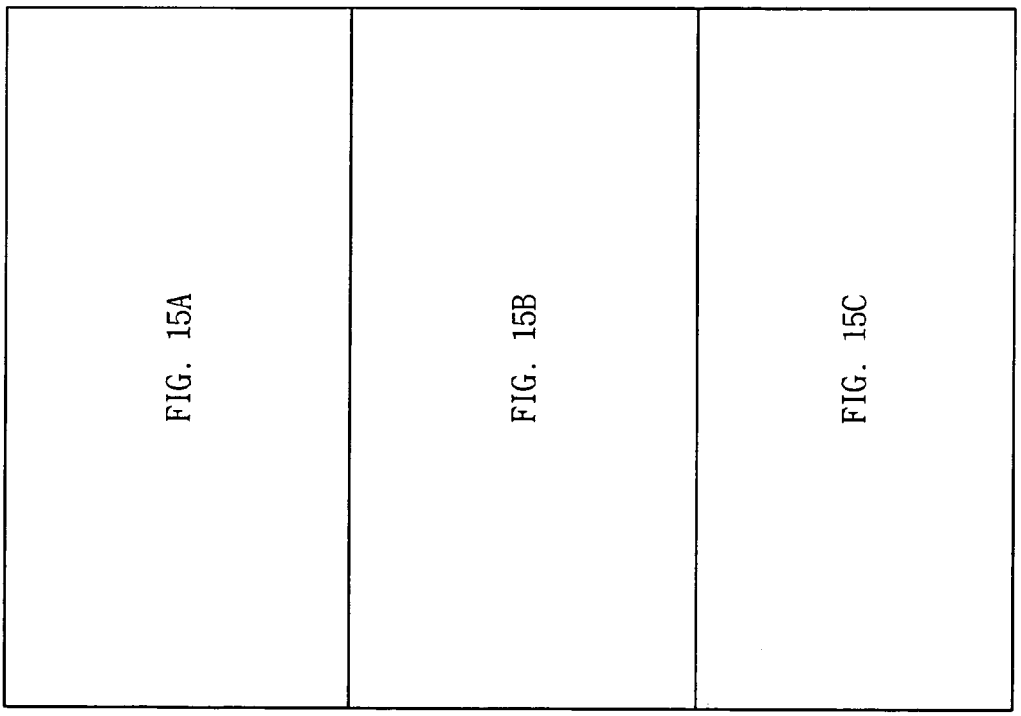
FIG. 15 is a flowchart of a memory device repair method according to an embodiment of the invention.
Figure 15A:
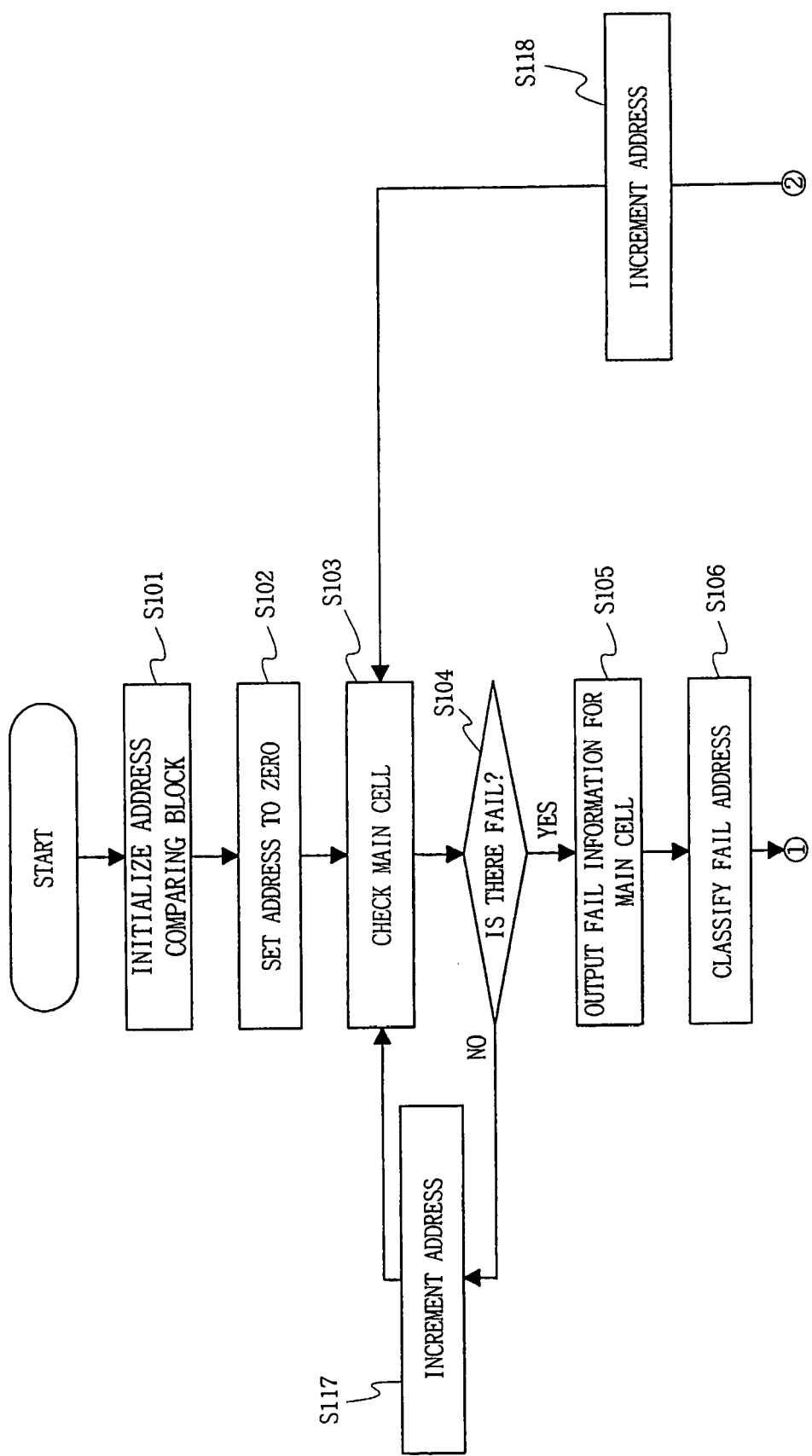
Figure 15B:
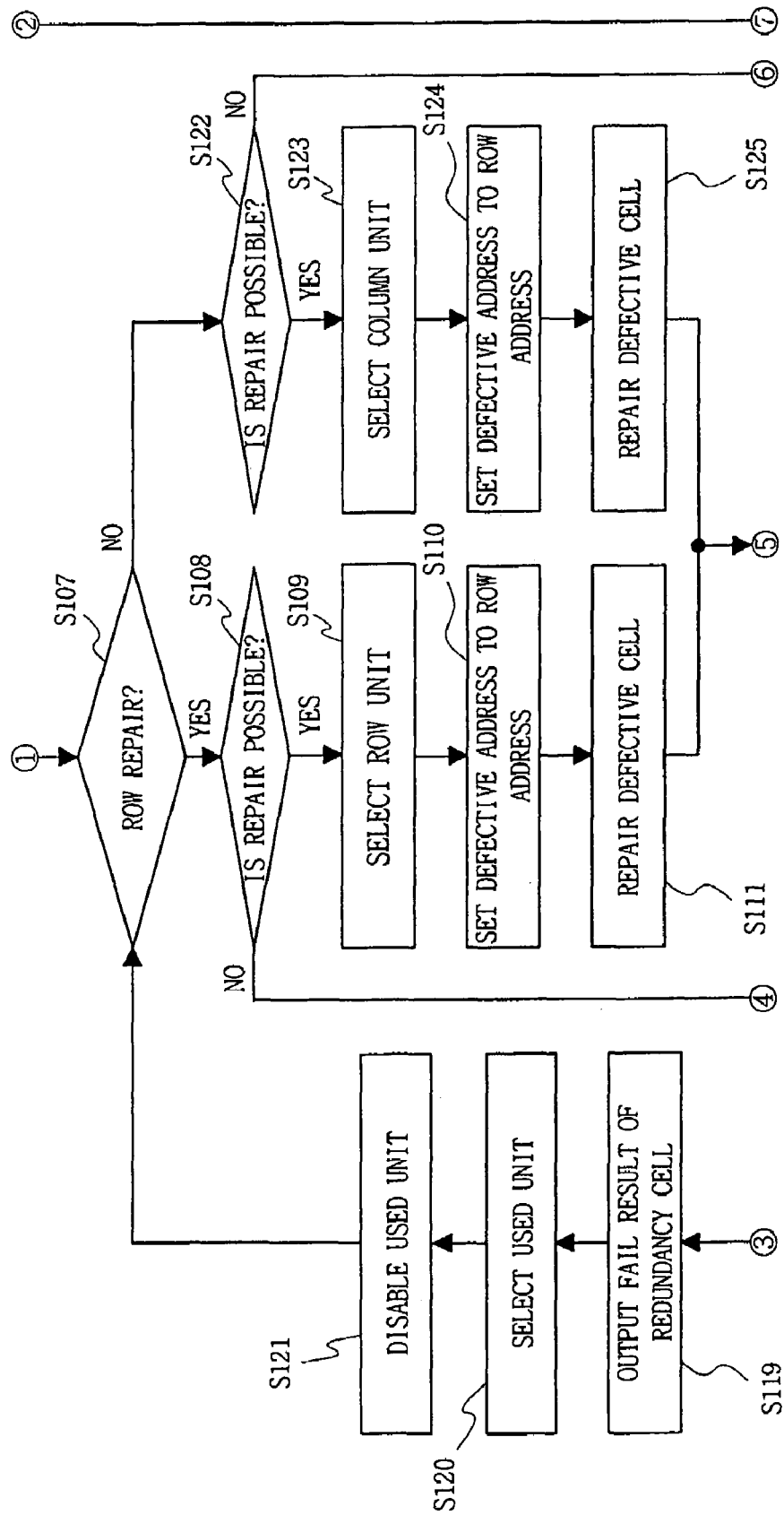
Figure 15C:
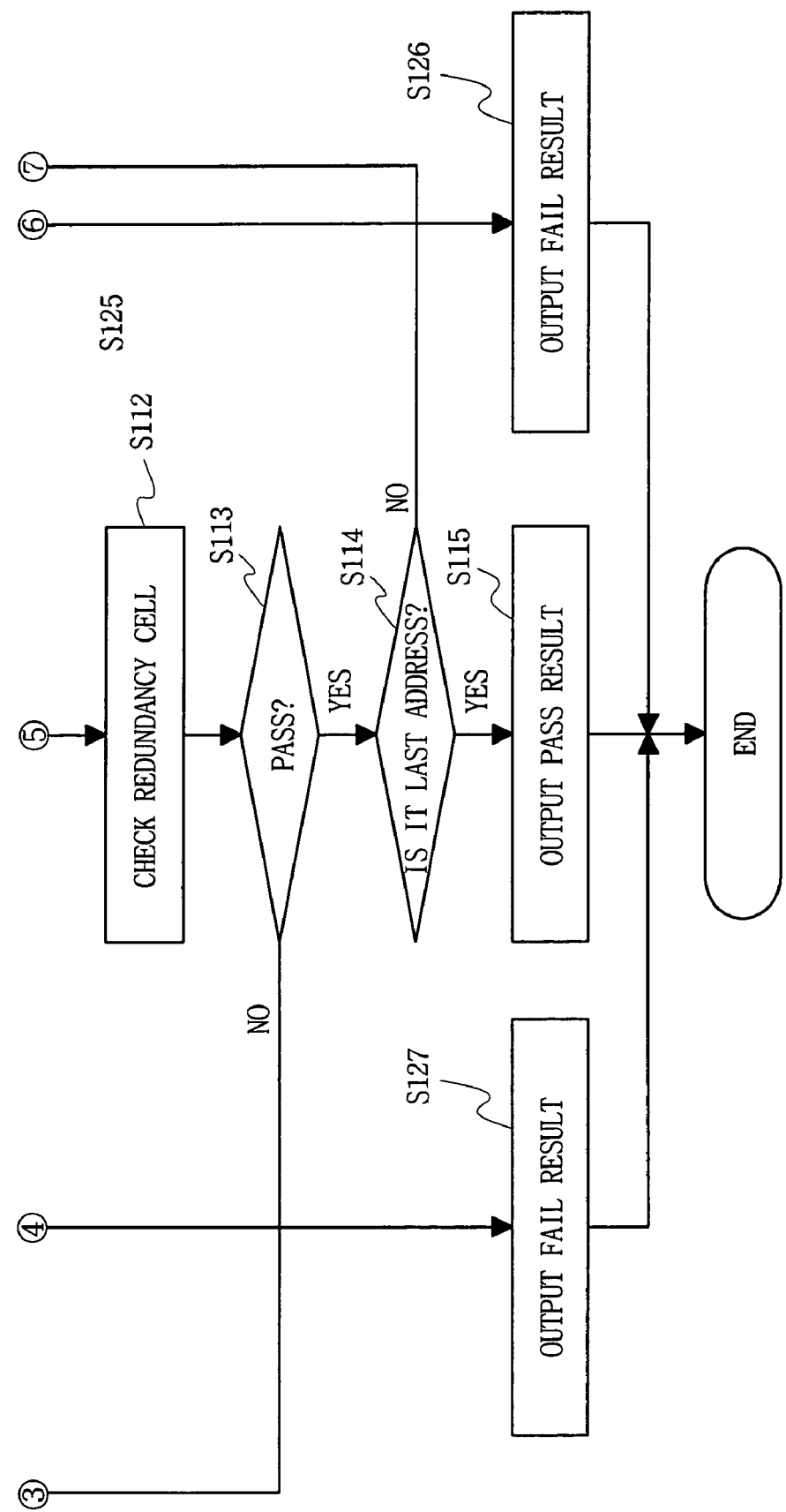

FIG. 15 is a flowchart of a repair method according to an embodiment of the invention in which a fail detected in memory cell test is immediately repaired.

Referring to FIG. 15, all address storage and comparison units (106X and 106Y of FIG. 4) are disabled using the redundancy circuit disable signal TM_EFK or initialized using the external redundancy circuit reset signal TM_AFR (S101) and then a start address is set to zero (S102) to perform main memory cell test.

During the test of main memory cell, it is determined whether there is a fail (S104) and when the fail is detected, fail information for the main cell (e.g., a failed cell address) is output (S105). It is determined whether it is a row fail or a column fail (e.g., based on the address specifying the defective (failed) cell) (S106). It is decided whether to perform a row repair or column repair based on the check result (S107).

If it is the row fail, it is determined whether the fail can be repaired (S108). If the repairing is impossible, a "fail result" is output (S127). If the row repair is possible, a row address storage and comparison unit to be used during repair programming is selected (S109): the address specifying the defective cell (a failed cell address) is used as the row address (S110); and an address that selects a row address storage and comparison unit (106X) to be used during repair programming is used as the column address to thereby select the row address storage and comparison unit (S109). Further, the row address storage unit selector 111X is enabled and the column address storage unit selector 111Y is disabled by a separate high address Aj. The address buffer outputs the second internal (failed cell) addresses FAiP and FAiPB under control of the external redundancy circuit enable signal TM_FEN, and the unit-enable or unit-disable information is stored in the selected unit's master cell and the bits of the second internal (failed cell) address are stored in the address bit storage and comparison cells of the selected row address storage and comparison unit, and the row address is thus programmed (stored) to perform the repair (S111).

If it is the column fail, it is determined whether the fail can be repaired (S122). If repairing is impossible, the "fail result" is output (S126). If the column repair is possible, the address specifying the defective main memory cell is used as the column address (S124). A column address storage and comparison unit is selected (S123). The address is used as the address to select the column address storage and comparison unit (S123) to be used during the repair. Further, the row address storage unit selector 111X is disabled and the column address storage unit selector 111Y is enabled by the high separate address Aj. Similar to the row repair, the column repair is performed by programming the column address storage and comparison unit, e.g., under control of the external redundancy circuit enable signal TM_FEN (S125). When the row or column repair is completed, the used redundancy cell is tested to determine whether the redundancy cell is failed (S112). If the redundancy cell is a pass (not failed) (S113), it is determined whether the repaired address is the last address (of the main memory) (S114). If it is the last address (of the main memory), a pass result is output (S115) and the repair is complete, and otherwise, the address is incremented (S118) and the process returns to the main memory cell checking step (S103).

If there is a fail in the redundancy cell used for the repairing (S113, S119), unit-disable information is programmed (stored) in the master cell of the used address storage and comparison unit (S121) (e.g., in response to the external repair disable signal TM_FCR) and then the repair is repeated (S107) using another address storage and comparison unit (S109). In other words, if a fail result of the redundancy cell is output (S119), the used address storage and comparison unit is selected according to the output (S120), and disabled (S121), and the repair process goes back to the step (S107) in which a determination is made again as to whether to perform a row repair or column repair.

Following the repair (S111 or S125), a test of the redundancy cell may be performed, as described above. Alternatively, the redundancy (memory) cells, the master cells and the address bit storage and comparison cells may be first subject to a test prior to the main memory cell test.

Figure 16B:
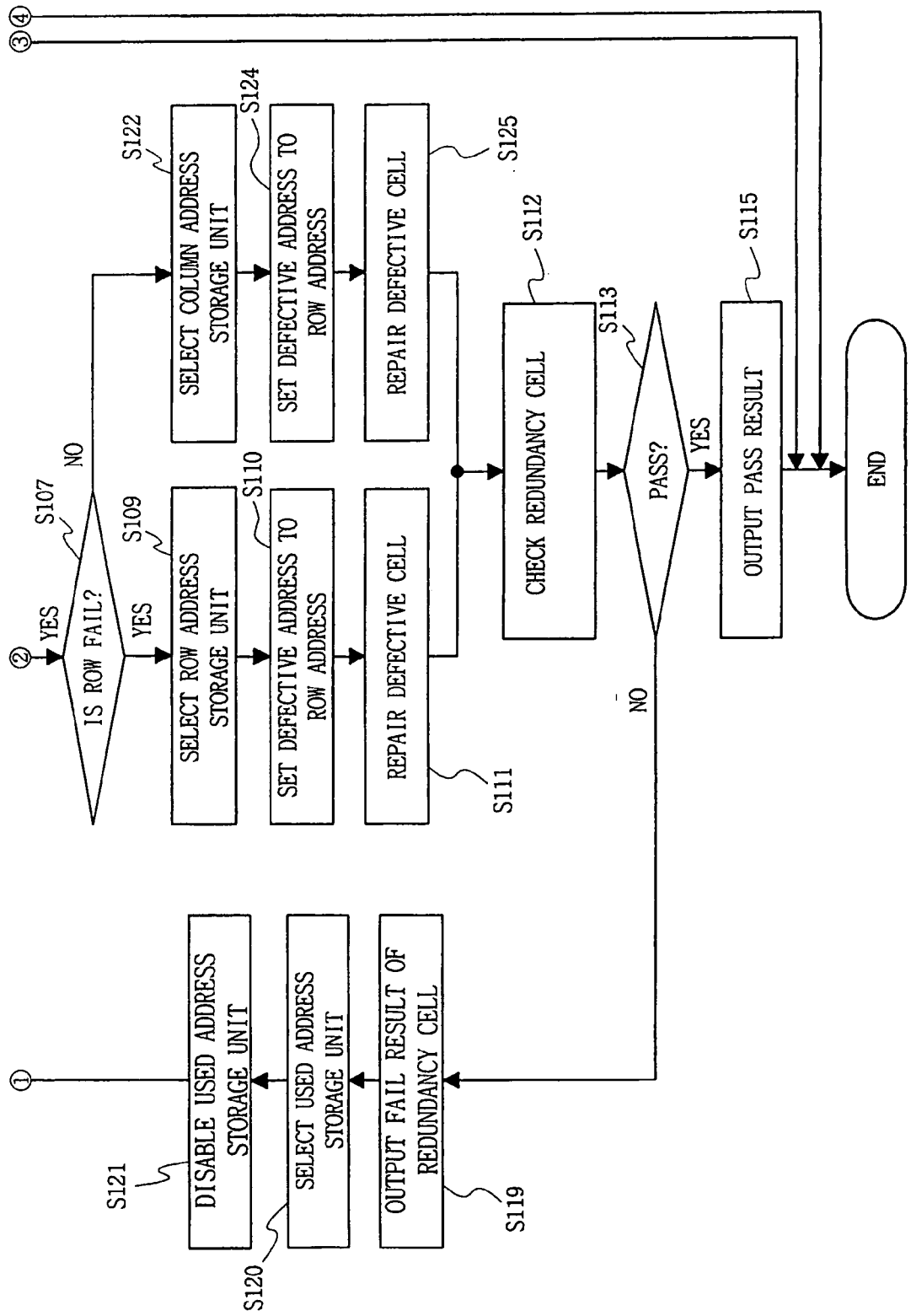
FIG. 16 is a flowchart of a memory device repair method according to an embodiment of the invention.

FIG. 16 is a flowchart of a repair method according to an embodiment of the invention, in which a main memory cell is tested and then a repair algorithm based on the test result is used to perform the repair.

Referring to FIG. 16, the outputs of all address storage and comparison units (106X and 106Y of FIG. 4) are disabled in response to a redundancy circuit disable signal TM_EFK or all address storage and comparison units (106X and 106Y of FIG. 4) are initialized in response to the external redundancy circuit reset signal TM_AFR (S201). Then, a main memory cell is tested (S202). It is determined whether there is a fail in the main cell (S203). When there is no fail in the main memory cell, a pass result is output (S220). When there is a fail in the main memory cell, fail information (including failed address information) for the failed main cell is output (S204). Next, row repairing or column repairing is performed based on the test result. A detailed description of the repair algorithm will be omitted because it is the same as that of FIG. 15.

In this case, however, redundancy cell test may be performed before the main cell test or after a repair. In the case where the redundancy cell test is performed prior to the main cell test, an address storage and comparison unit corresponding to a defective redundancy cell should not be used for repairing. Further, in the case where the redundancy cell test is performed following the repair, all redundancy cells are subject to a test following the repair. When there is a fail in the redundancy cell, a corresponding address storage and comparison unit is disabled and another address storage and comparison unit is used for the repair.

As described above, the invention is directed to a semiconductor memory device comprising a plurality of programmable ferroelectric address-storage cells, unlike a conventional repair method with physical fuse cutting. The invention is also directed to an electrical repair method in which an address is used as decoding information for selecting one of a plurality of address storage and comparison units (106X and 106Y of FIG. 4) and also as defective cell information programmed (stored) in the ferroelectric address-storage cells of the address storage and comparison units.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

As described above, a redundancy circuit with ferroelectric address-storage cells and a repair method according to the invention are capable of solving the problem that in a conventional physical (fuse) repair method it is impossible to undo or repeat a repair when a defective cell is created or detected after a repair or after a packaging process.

Further, a redundancy circuit with ferroelectric storage cells and a repair method according to the invention are capable of removing limitations on repair time and on the number of repairs when a defective cell is detected.

Further, a redundancy circuit with ferroelectric address-storage cells and a repair method according to the invention are capable of eliminating the need for an additional separate process for providing an optical window in the fabrication of a semiconductor memory device (needed to allow the use of the physical repair method in which a fuse is cut using a laser beam).

Further, a redundancy circuit with ferroelectric address-storage cells and a repair method according to embodiments of the invention are capable of reducing the time to drive a redundancy memory cell (by prefetching and latching failed-address (repair) information stored in a plurality of non-volatile (e.g., ferroelectric) storage cells when power is turned on, thus enabling the redundancy circuit to rapidly compare any input addresses to the stored address(es).

Further, a redundancy circuit having a plurality of non-volatile (e.g., ferroelectric) address-storage cells and a repair method according to embodiments of the invention stores the address(es) specifying a defective main memory cell(s) during a repair (redundancy-programming) mode; and later, during normal memory device operation uses the stored failed (defective memory) address(es) as redundancy-programming information to select one of a plurality of redundancy array cells.

What is claimed is:

1. A redundancy circuit of a semiconductor memory device, comprising:

a plurality of address storage and comparison units, each one of the address storage and comparison units being configured to store an address of the semiconductor memory device and to output a match signal if a first internal address matches the stored address;

wherein each address storage and comparison unit comprises a master cell having non-volatile ferroelectric storage cells for storing bits of enabling or disabling information for enabling or disabling an output of the corresponding address storage and comparison unit, wherein each address storage and comparison unit further comprises a plurality of address bit storage and comparison cells having non-volatile ferroelectric storage cells for storing bits of a failed memory address of the semiconductor memory device and configured to compare each of the stored bit with the first internal address and to output the match signal as the comparison result, and wherein the match signal and the output of the master cell are fed to a logic unit to enable the output of the address storage and comparison unit.

2. The circuit according to claim 1, further comprising an address buffer for outputting the first internal address and second internal address based on an external address.

3. The circuit according to claim 1, wherein the address buffer is controlled by an external redundancy circuit enable signal that enables the redundancy circuit during repairing.

4. The circuit according to claim 3, wherein the address buffer outputs the second internal address obtained by ANDing the external address and the external redundancy circuit enable signal.

5. The circuit according to claim 1, wherein the match signal is high when the first internal address and the stored memory address are the same, and is low when the two addresses are not the same.

* * * * *